(12) United States Patent
Tanaka

(10) Patent No.: US 8,194,415 B2
(45) Date of Patent: Jun. 5, 2012

(54) BACKLIGHT DEVICE AND LIQUID CRYSTAL DISPLAY DEVICE

(75) Inventor: Toshiaki Tanaka, Kodaira (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 798 days.

(21) Appl. No.: 12/248,928

(22) Filed: Oct. 10, 2008

(65) Prior Publication Data
US 2009/0096953 A1    Apr. 16, 2009

(30) Foreign Application Priority Data

Oct. 12, 2007    (JP) .................................. 2007-266024

(51) Int. Cl.
*H05K 1/11*    (2006.01)
*H05K 1/14*    (2006.01)
(52) U.S. Cl. ................... 361/784; 361/780; 361/782
(58) Field of Classification Search .......... 361/780–782; 362/167–170
See application file for complete search history.

(56) References Cited

U.S. PATENT DOCUMENTS

| | | | | |
|---|---|---|---|---|
| 6,345,903 | B1 * | 2/2002 | Koike et al. | 362/241 |
| 6,834,977 | B2 * | 12/2004 | Suehiro et al. | 362/187 |
| 7,436,000 | B2 * | 10/2008 | Kim et al. | 257/98 |
| 2002/0001192 | A1 | 1/2002 | Suehiro et al. | |
| 2005/0276052 | A1 | 12/2005 | Shimada et al. | |
| 2006/0163596 | A1 | 7/2006 | Kim et al. | |
| 2006/0267036 | A1 | 11/2006 | Lee et al. | |
| 2007/0035969 | A1 | 2/2007 | Kaneko et al. | |
| 2007/0170452 | A1 | 7/2007 | Kurokawa et al. | |

FOREIGN PATENT DOCUMENTS

| | | |
|---|---|---|
| JP | 10-226107 | 8/1998 |
| JP | 2001-345485 | 12/2001 |
| JP | 2004-199896 | 7/2004 |
| JP | 2005-093097 | 4/2005 |
| JP | 2005-283852 | 10/2005 |
| JP | 2005-340392 | 12/2005 |
| JP | 2006-210880 | 8/2006 |
| JP | 2006-339639 | 12/2006 |
| JP | 2007-36073 | 2/2007 |
| JP | 2007-109945 | 4/2007 |
| JP | 2007-305434 | 11/2007 |

\* cited by examiner

*Primary Examiner* — Tuan T Dinh
(74) *Attorney, Agent, or Firm* — Antonelli, Terry, Stout & Kraus, LLP.

(57) ABSTRACT

A light-emitting diode element including a through hole and a thermal via hole is mounted. An electrical connection region and a heat radiation region with respect to a plurality of packages or substrates are separately mounted on a printed circuit board. Electrical connection is made in the printed circuit board, and a driver, a resistance, a capacitor, and the like are connected. Heat is diffused and radiated by heat transport to a heat radiation base material connected to the printed circuit board.

15 Claims, 21 Drawing Sheets

BACKLIGHT DEVICE AND LIQUID CRYSTAL DISPLAY DEVICE

CROSS-REFERENCE TO RELATED APPLICATION

The present application claims priority from Japanese application JP 2007-266024 filed on Oct. 12, 2007, the content of which is hereby incorporated by reference into this application.

BACKGROUND OF THE INVENTION

1. Field of the Invention

The present invention relates to a backlight device using a light-emitting diode element, and to a liquid crystal display device.

2. Description of the Related Art

In recent years, a thin and lightweight module structure is indispensable for a liquid crystal display device. The performance is required to be maintained or improved while, with regard to members mounted on the module, the number of the members is sought to be reduced and thinning and reducing weight of the members are sought. With regard to a backlight source module of a large liquid crystal display device, it is made possible to, using a light-emitting diode element, widen the range of color reproduction, improve high-speed independent control which accommodates moving images, and improve contrasts compared with a conventional cold-cathode tube. However, it is still necessary to take measures for a thinner and lighter size. With regard to heat radiation, it is also important to maintain the thin and light size while a heat radiation structure is formed.

When a light-emitting diode element is used to form a thin and lightweight backlight source module, it is necessary that members mounted thereon and a connection structure are simplified to accommodate a thin and light size. The following documents disclose packages of backlight source modules which reduce the number of members mounted thereon and which are adapted for simplified connection.

JP 2001-345485 A discloses a structure in which a pair of metal layers are provided on a front surface and a rear surface of a package base material to materialize a more compact package, and heat is radiated by connecting the metal layers via a metal connecting portion. This makes, when a plurality of light-emitting elements are mounted, heat radiation properties uniform, and thus, temporal change of the color balance is reduced. JP 2006-210880 A discloses that an optical layer is laminated on a base substrate having through holes formed thereinto form a two-dimensional surface light source. This makes the light source smaller in size and simplifies a fabricating process of a backlight. JP 10-226107 A discloses that, in an optical print head having a common electrode and a light-emitting element module, a through hole for radiating heat is provided so as to pierce a substrate from a top surface to a bottom surface thereof, and a heat conductive material layer is formed on an inner wall of the through hole. This makes heat radiated via the through hole to the downside of the substrate. JP 2007-109945 A discloses that a non-flow type adhesive or a thermocompression bonding type adhesive such as a bonding sheet is applied to a mounting substrate on which arrays of a plurality of light-emitting elements are arranged in lines. This makes it possible to enhance heat radiation with no increase in cost and to effectively use light diffused by the light-emitting elements.

SUMMARY OF THE INVENTION

Conventionally, in an LED device package, a heat radiation structure is provided through a through hole from a top surface to a bottom surface thereof to improve the heat radiation characteristics. However, a systematic heat radiation structure which considers a heat radiation path after that is not described in detail.

Further, electrical connection and an optical structure for operating a light source are not described in detail, and a structure which is compatible with a heat radiation structure is not described in detail.

In a backlight of a liquid crystal display device or the like in which a plurality of LED packages are arranged, the heat radiation characteristics are required to be uniform over the whole system, and it is an important problem to control distribution of brightness and chromaticity and suppress unevenness.

The present invention has been made to solve the above-mentioned problem, and it is an object of the present invention to provide a backlight device, which improves the heat radiation characteristics and suppresses deterioration of efficiency due to thermal saturation, and a liquid crystal display device using such a backlight device.

In order to solve the above-mentioned problem, a backlight device according to the present invention includes: a package light source having at least one LED element mounted at a center thereof; a heat radiation region provided immediately below the at least one LED element; one of an electrical connection wiring line and an electrical connection region provided on one of left side and right side of the at least one LED element and conducting to the at least one LED element so as to form an asymmetric conductive region; a printed circuit board having the package light source mounted thereon, the printed circuit board having a heat radiation structure so as to correspond to the heat radiation region provided immediately below the at least one LED element; and a wiring region for the printed circuit board provided so as to correspond to the one of the electrical connection wiring line and the electrical connection region formed so as to be asymmetric.

Another backlight device according to the present invention includes: a plurality of package light sources for mounting a plurality of LED elements thereon, the plurality of LED elements being mounted so as to be reflection symmetric with respect to the plurality of package light sources, the plurality of package light sources being provided so as to correspond to each other in at least two lines; and one of electrical connection wiring lines and electrical connection regions formed so as to be asymmetric with respect to the plurality of LED elements and opposed to each other. By mounting the plurality of package light sources so as to correspond to each other in at least two lines on a printed circuit board, the plurality of package light sources have an electric circuit region and heat radiation regions for the printed circuit board separated from each other. The electric circuit region is connected by wiring on an inner side of the printed circuit board to control driving thereof, and the heat radiation regions for the printed circuit board are in end regions on outer sides of the printed circuit board and having a structure for radiating heat from immediately below the plurality of LED elements.

Still another backlight device according to the present invention includes a printed circuit board having one of a plurality of package light sources and a plurality of substrates mounted thereon, the one of the plurality of package light sources and the plurality of substrates having a plurality of LED elements mounted thereon. The printed circuit board includes: an electrical connection region corresponding to one of an inside surrounded by the plurality of package light sources and a lower side of the mounted plurality of substrates and provided with electrical connection; and a heat radiation region corresponding to one of an outside of the region surrounded by the plurality of package light sources mounted on the printed circuit board and an outside of the mounted plurality of substrates including a part of a lower side of the plurality of substrates and having a structure of a material for heat radiation which transports heat by one of heat conduction and thermal diffusion. The electrical connection region and the heat radiation region are separated from each other on the printed circuit board.

The backlight device which improves the heat radiation characteristics and suppresses deterioration of efficiency due to thermal saturation, and the liquid crystal display device using such a backlight device can be provided.

DETAILED DESCRIPTION OF THE INVENTION

Embodiments of the present invention for solving the above-mentioned problem are now described.

The following embodiments of the present invention are described in the context of a package structure having an LED element mounted thereon as a light source of an illuminating device or a liquid crystal display device from the viewpoint of a structure and electrical connection of members mounted thereon and a heat radiation structure. The structure is designed based on a concept of separating an electrical connection region and a heat radiation region.

[First Embodiment]

A first embodiment of the present invention is described with reference to FIGS. 1 to 17.

In this embodiment, connection for conducting current and connection for heat radiation are made to an LED element as a light source to separate an electrical connection region and a heat radiation region in a following way. First, a package light source is formed having a through hole for conducting current and a thermal via hole for heat radiation formed therein. Here, the thermal via hole for heat radiation is formed at the center of the package such that the element is located immediately above the thermal via hole while the through hole for conducting current is provided only on one side of the element.

Figure 1:
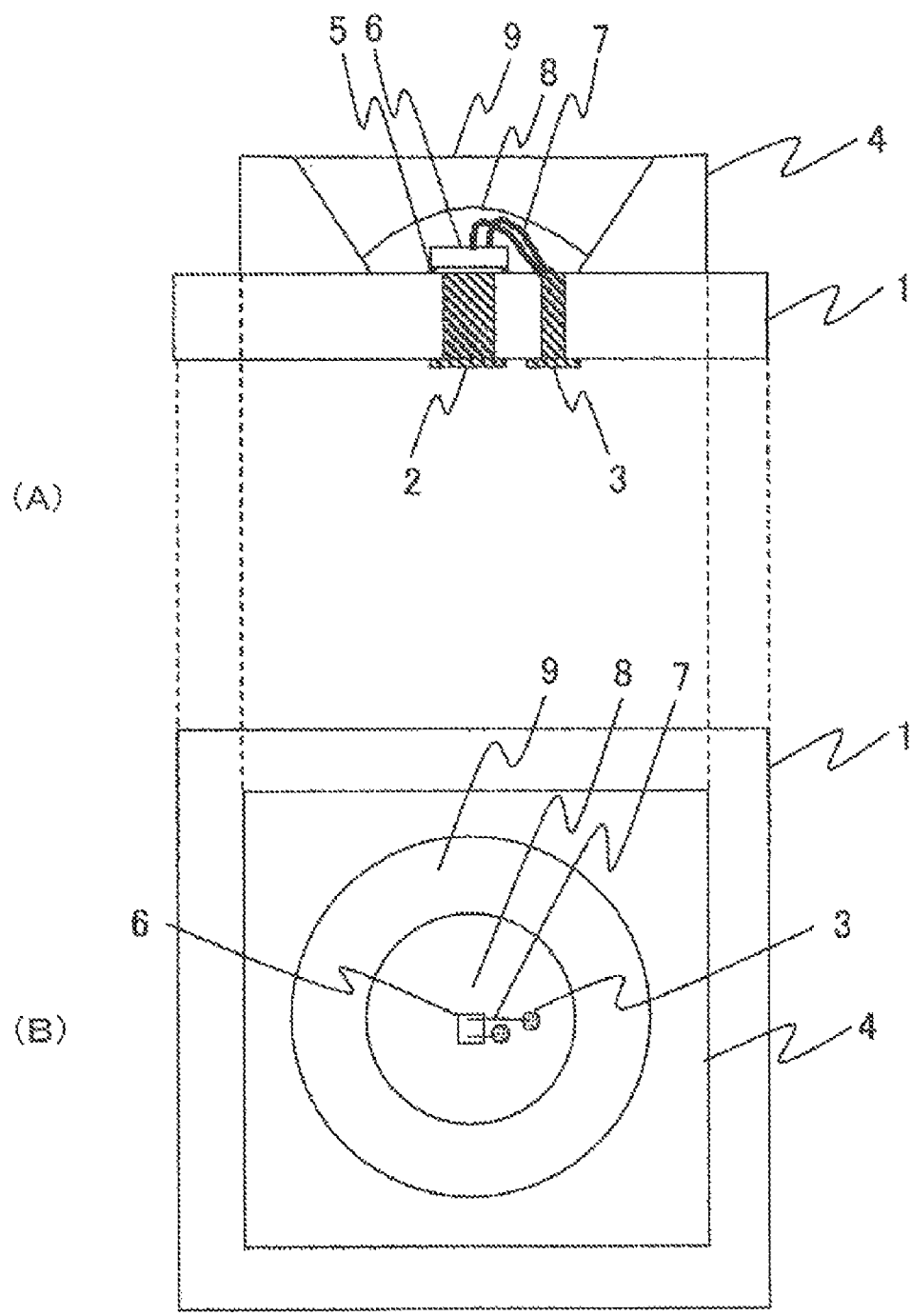
FIGS. 1 illustrate an exemplary package light source of a backlight device according to a first embodiment of the present invention.

FIG. 1 illustrates a structure in section of the package in part (A) and illustrates a structure seen from the top of the package having a blue element for exciting a fluorescent material mounted thereon in part (B). A metal region 2 for heat radiation and two metal regions 3 for conducting current are formed in a ceramic substrate 1. After a reflector plate 4 is provided thereabove, a two-wire-type blue LED element 6 is mounted on the metal region 2 for heat radiation using a die bonding material 5. Further, the blue LED element 6 is connected to the two metal regions 3 for conducting current by gold wire 7. After that, a fluorescent material 8 having its fluorescence spectra from green to red to be excited by blue light is disposed, and then a transparent resin 9 is used for sealing to obtain a white light source. Here, as illustrated in part (B) of FIG. 1, the two metal regions 3 for conducting current are provided only on one side of the element. This accommodates a structure in which the electrical connection region and the heat radiation region of the element are separated.

Figure 2:
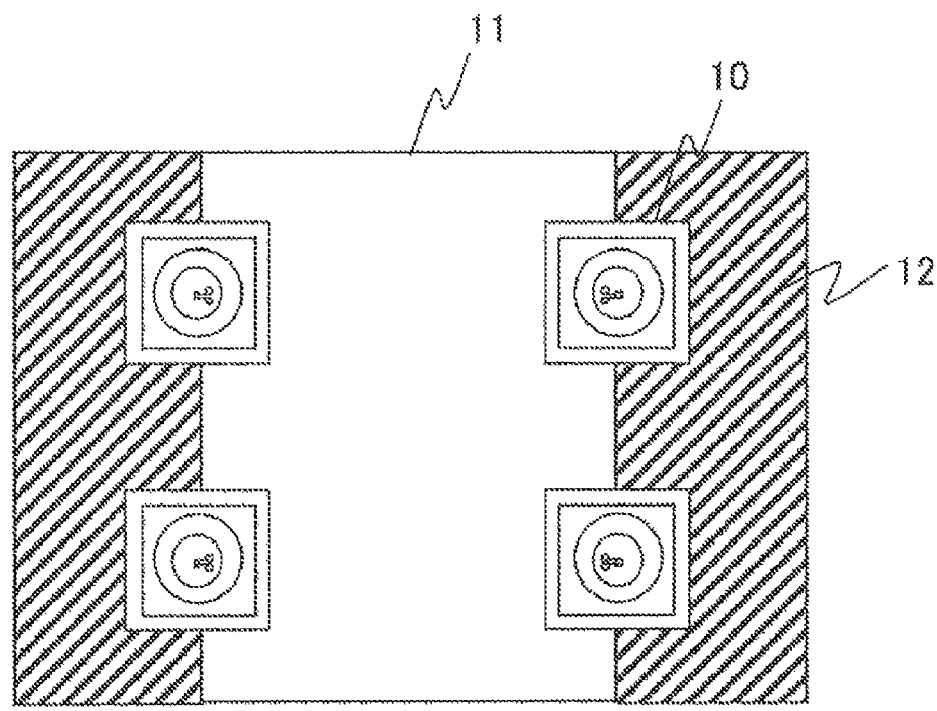
FIG. 2 is a top view illustrating an exemplary printed circuit board having the package light sources mounted thereon according to the first embodiment of the present invention.
Figure 3:
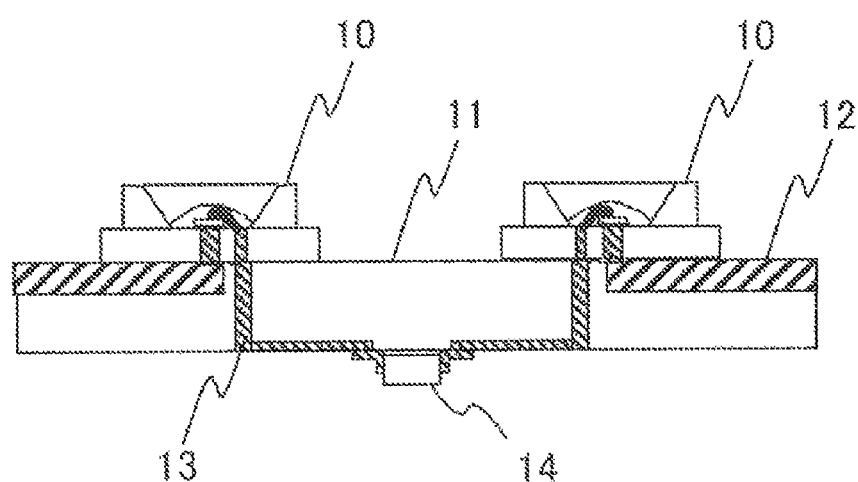
FIG. 3 is a sectional view illustrating the exemplary printed circuit board having the package light sources mounted thereon according to the first embodiment of the present invention.

Then, surface mount type package light sources illustrated in FIGS. 2 and 3 are mounted on a printed circuit board. FIGS. 2 and 3 illustrate a part of the package light sources mounted on the printed circuit board. As illustrated in FIG. 2, manufactured white light source packages 10 are mounted on a printed circuit board 11. Copper thin films 12 for heat radiation are provided on both sides of the printed circuit board 11.

As illustrated in FIG. 3, the copper thin films 12 and wiring 13 for conducting current are in advance provided for the printed circuit board 11 to make connection to the metal region 2 for heat radiation and to the two metal regions 3 for conducting current, respectively, of the package, and the connection is made using a solder paste or the like. The wiring 13 for conducting current is provided so as to correspond to a rear surface of the printed circuit board 11 and is adapted to be connected to a multi-channel driver IC 14 for controlling operation of the package light sources. Here, a resistance and a capacitor are also mounted for stable operation. In this embodiment, the wiring is connected to the multi-channel driver IC 14 such that the package light sources are individually operated.

By the structure described above, the LED elements in the packages and the driver IC element can be electrically connected with each other within an inside region of the printed circuit board to be operated. Further, heat generated at the LED elements in the packages can be radiated by thermal diffusion to both outer sides of the printed circuit board through the thermal via holes for heat radiation and through the copper thin films for radiating heat from the printed circuit board. These make it possible to provide a structure in which the connection for conducting current and the connection for heat radiation are made to the LED element as a light source such that the electrical connection region and the heat radiation region are separated.

Figure 4:
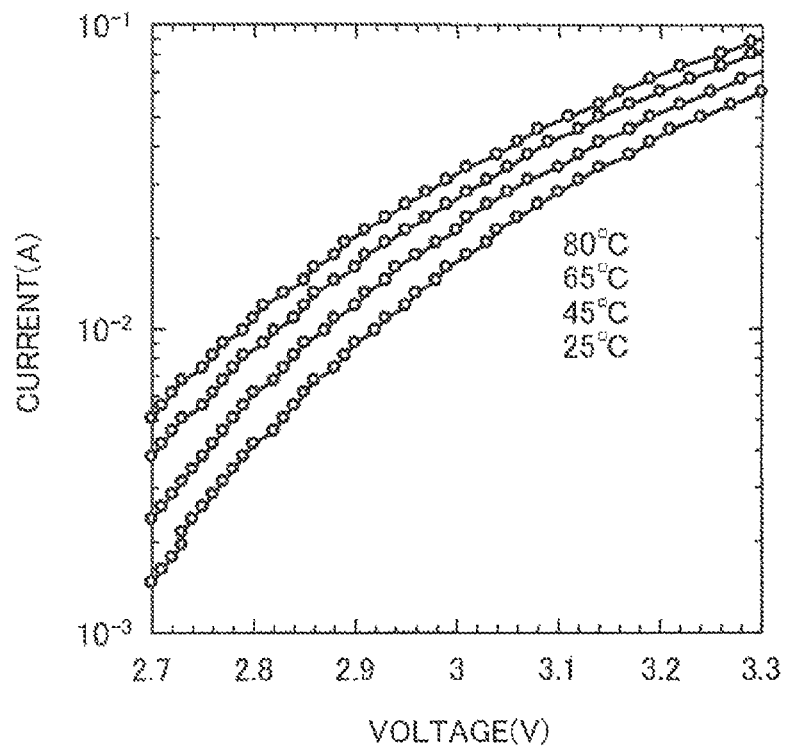
FIG. 4 is a graph illustrating current-voltage characteristics by temperature of a package light source blue element mounted on a printed circuit board without a heat radiation structure of the conventional art.
Figure 5:
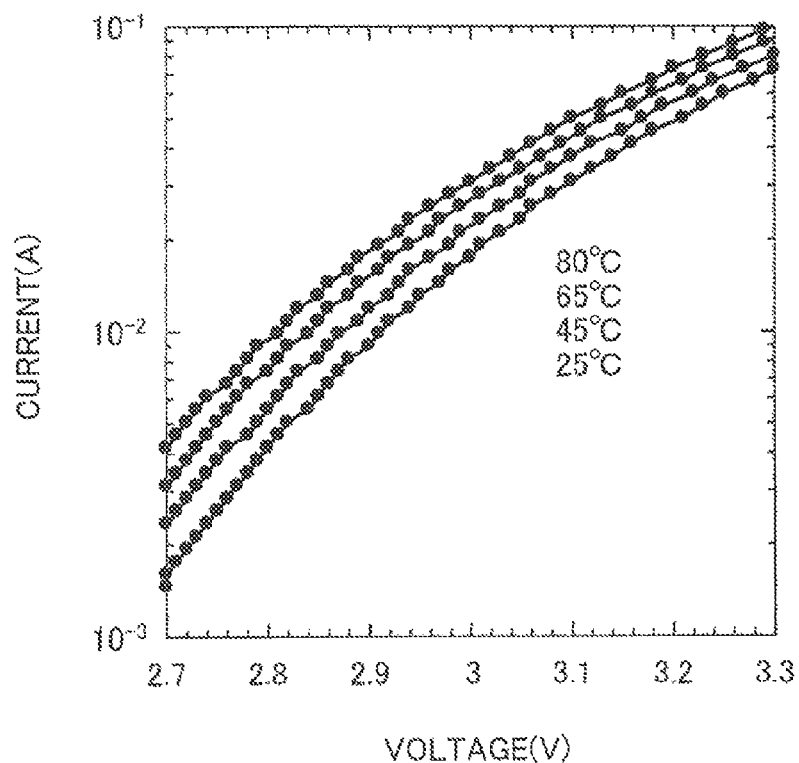
FIG. 5 is a graph illustrating current-voltage characteristics by temperature of a package light source blue element mounted on a printed circuit board with a heat radiation structure according to the first embodiment of the present invention.

When change in the characteristics under the influence of temperature was studied with regard to the package light source which was mounted on the printed circuit board 11 having the heat radiation regions 12 as the copper thin films, it was revealed that, compared with a case in which connection was made to a conventional printed circuit board without a heat radiation region, change in the electrical characteristics as the temperature changes could be suppressed. FIG. 4 illustrates current-voltage characteristics of a blue LED element mounted on a package which is connected to a conventional printed circuit board without a heat radiation region. FIG. 5 illustrates current-voltage characteristics of a blue LED element similarly mounted on a package which is connected to the printed circuit board with the heat radiation region according to this embodiment.

The dependence of current-voltage characteristics on temperature is compared between FIG. 4 and FIG. 5. From the result of measurement from 25° C. to 80° C., there is a tendency that, in the case of the printed circuit board with the heat radiation region, change in the current-voltage characteristics as the temperature changes is relatively smaller and the amount of change in current with regard to a same voltage is suppressed.

Figure 6:
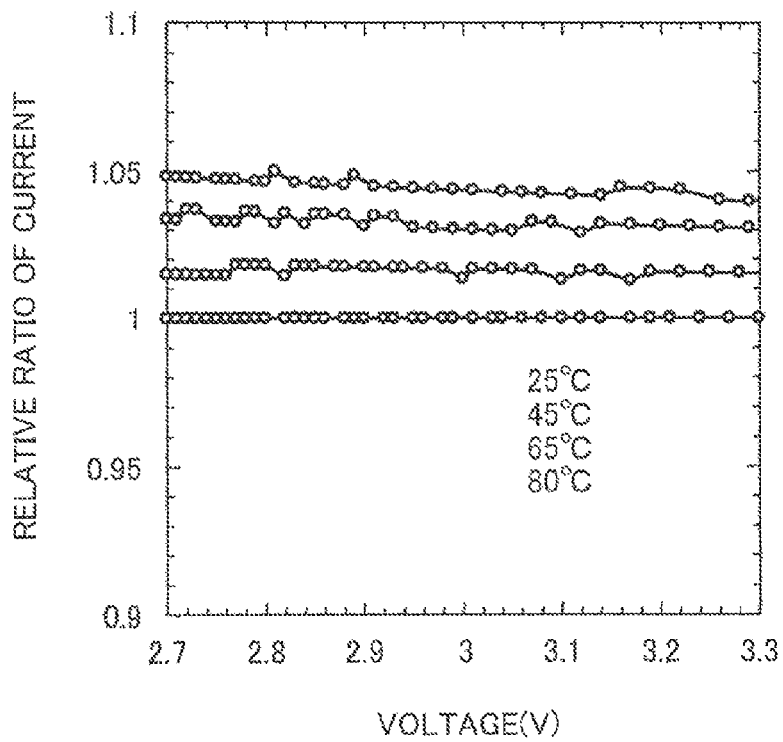
FIG. 6 is a graph illustrating relative ratio of current by temperature of the package light source blue element mounted on the printed circuit board without the heat radiation structure of the conventional art.
Figure 7:
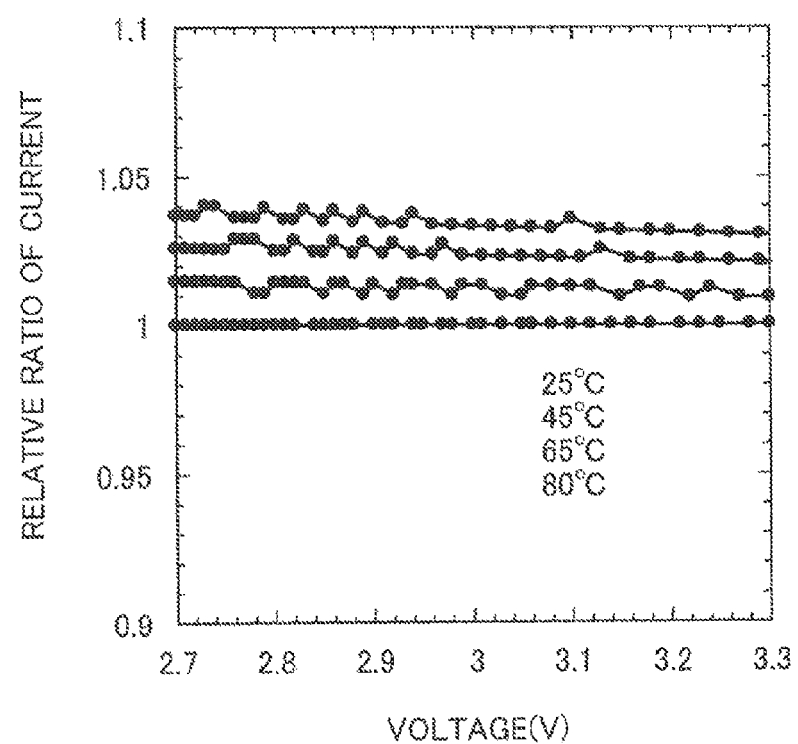
FIG. 7 is a graph illustrating relative ratio of current by temperature of the package light source blue element mounted on the printed circuit board with the heat radiation structure according to the first embodiment of the present invention.

Similarly, FIGS. 6 and 7 are graphs the horizontal axis of which represents voltage and relative ratio of current is plotted with regard to the respective temperatures. FIG. 6 is a graph when connection is made to a conventional printed circuit board without a heat radiation region, while FIG. 7 is a graph when connection is made to the printed circuit board with the heat radiation region according to this embodiment. With regard to the respective temperatures, the relative ratio of current with regard to a same voltage is smaller in the case of the printed circuit board with the heat radiation region. It is clear that change in the current as the temperature changes is suppressed.

Figure 8:
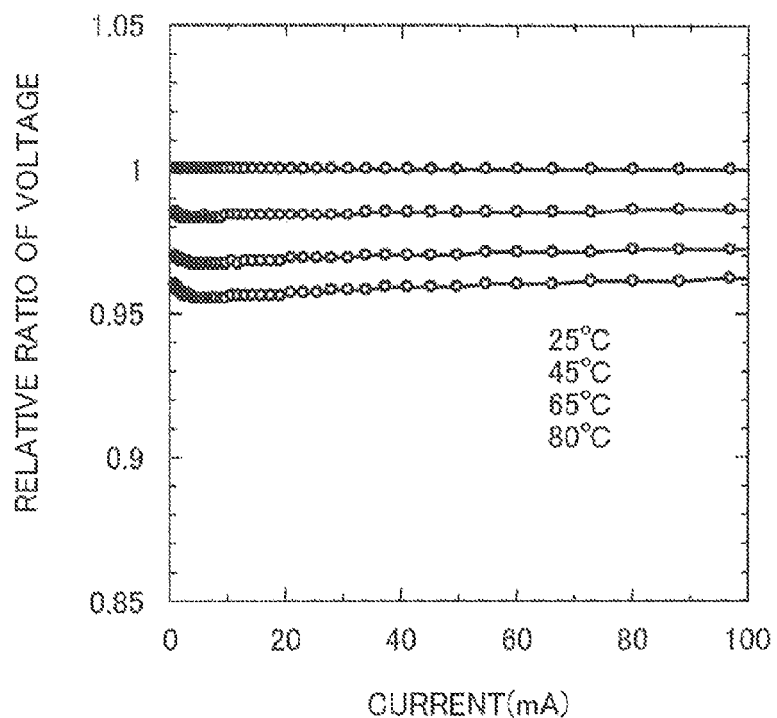
FIG. 8 is a graph illustrating relative ratio of voltage by temperature of the package light source blue element mounted on the printed circuit board without the heat radiation structure of the conventional art.
Figure 9:
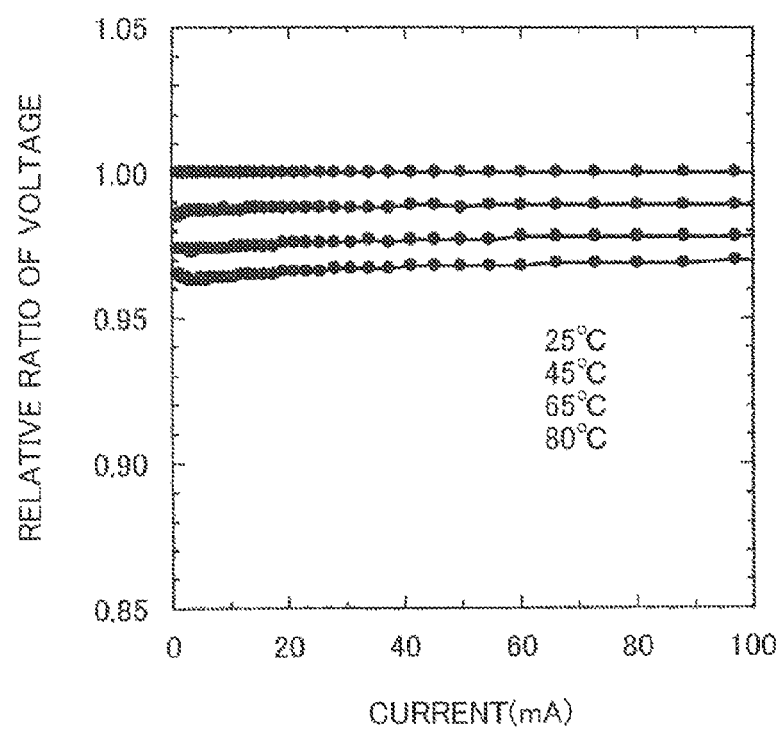
FIG. 9 is a graph illustrating relative ratio of voltage by temperature of the package light source blue element mounted on the printed circuit board with the heat radiation structure according to the first embodiment of the present invention.

Similarly, FIGS. 8 and 9 are graphs the horizontal axis of which represents current and relative ratio of voltage is plotted with regard to the respective temperatures. FIG. 8 is a graph when connection is made to a conventional printed circuit board without a heat radiation region, while FIG. 9 is a graph when connection is made to the printed circuit board with the heat radiation region according to this embodiment. Here, with regard to the respective temperatures, the ratio of drop of voltage with regard to a same current is smaller in the case of the printed circuit board with the heat radiation region, and change in the voltage as the temperature changes is suppressed. This means that, on the conventional printed circuit board in which a satisfactory heat radiation structure is not formed, effective temperature of the element is increased. From the above, it is revealed that the structure according to this embodiment, from the package with the heat radiation structure to the printed circuit board, is effective, and, with regard to the current-voltage characteristics, the results illustrated in FIGS. 4 to 9 reveal that relative ratio of change as the temperature changes is suppressed to be on the order of 80%.

The package light sources may be connected in series through wiring on the printed circuit board.

Figure 10:
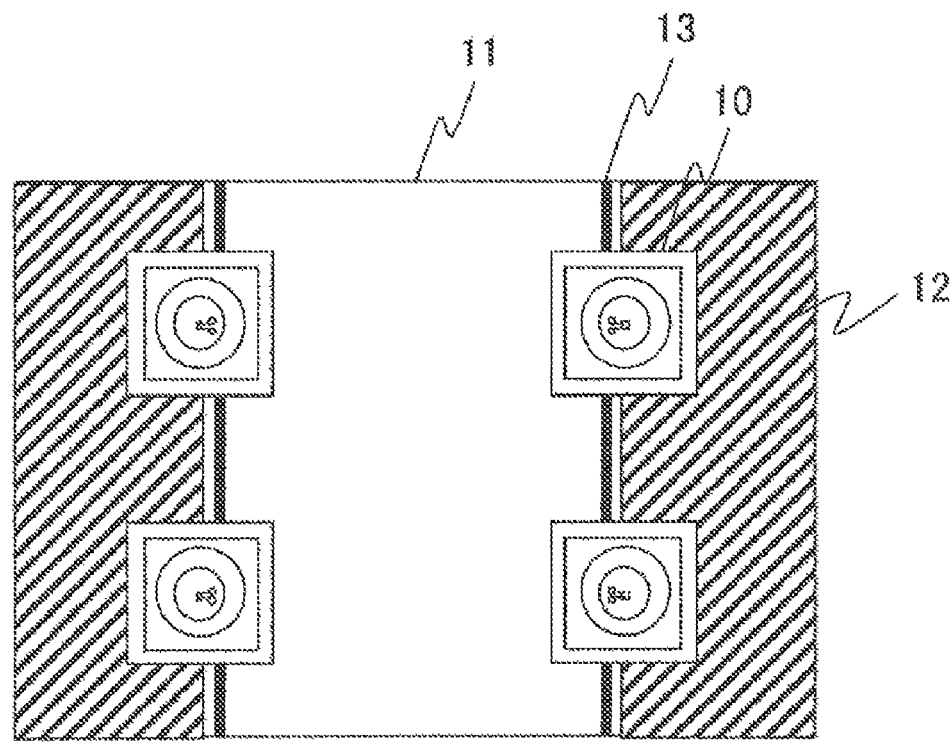
FIG. 10 is a top view illustrating another exemplary printed circuit board having a package light sources mounted thereon according to the first embodiment of the present invention.
Figure 11:
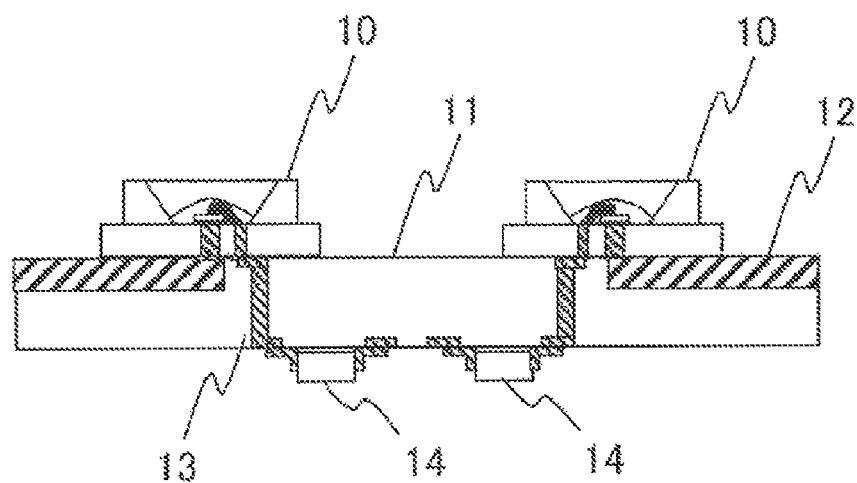
FIG. 11 is a sectional view illustrating the another exemplary printed circuit board having a package light sources mounted thereon according to the first embodiment of the present invention.

FIGS. 10 and 11 illustrate a structure in which the package light sources are connected in series in a longitudinal direction. The package light sources may be connected in series through wiring on a front surface side or wiring on a rear surface side of the printed circuit board 11. As illustrated in FIG. 11, the multi-channel driver ICs 14 are connected so as to accommodate a plurality of package light sources connected in series and can control the operation of the plurality of package light sources. This makes it possible to drive the package light sources connected in series with regard to each line in which some of the package light sources are connected in series. Further, because backlight sources are controlled area by area, it is also possible to control the operation of a plurality of serially connected package light sources which accommodate area control.

Figure 12:
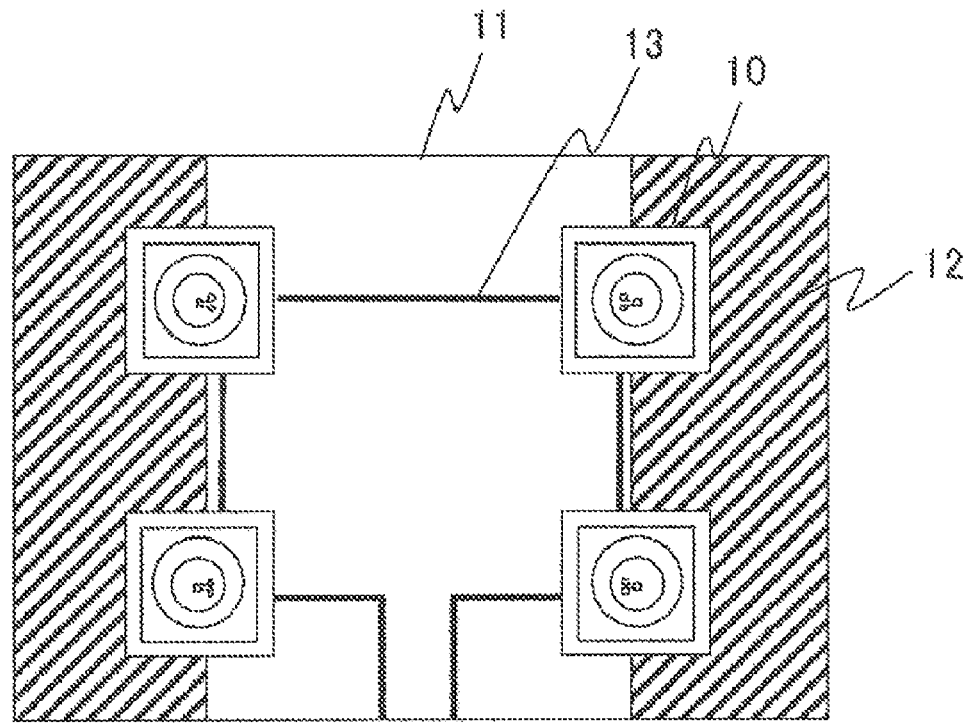
FIG. 12 is a top view illustrating still another exemplary printed circuit board having the package light sources mounted thereon according to the first embodiment of the present invention.
Figure 13:
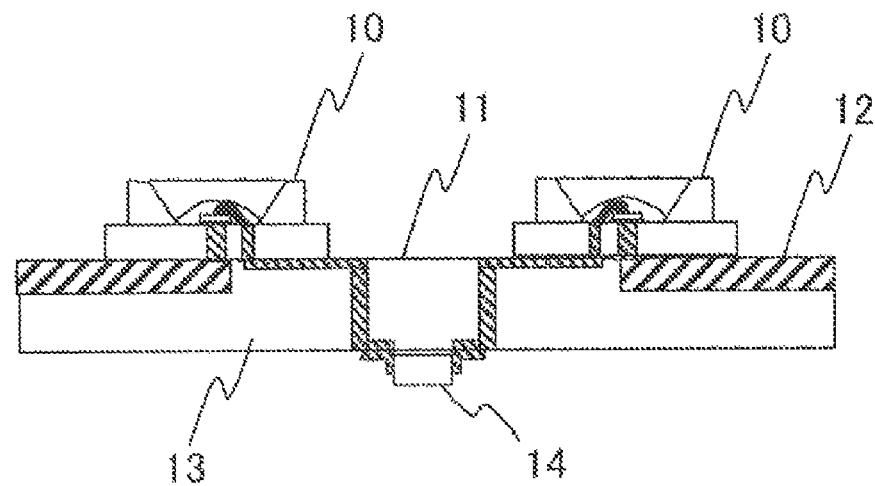
FIG. 13 is a sectional view illustrating the still another exemplary printed circuit board having the package light sources mounted thereon according to the first embodiment of the present invention.
Figure 14:
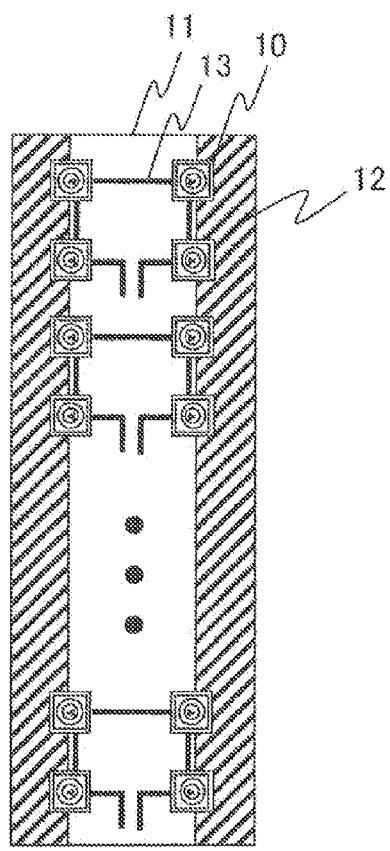
FIG. 14 is a top view illustrating an exemplary structure of a printed circuit board accommodating the backlight device according to the first embodiment of the present invention.

FIGS. 12 and 13 illustrate a structure in which four package light sources are connected in series. The package light sources may be connected in series through wiring on the front surface side or wiring on the rear surface side of the printed circuit board 11. As illustrated in FIG. 14, the multi-channel driver IC 14 is connected so as to accommodate four package light sources connected in series and can control the operation of the package light sources. This makes it possible to drive package light sources which accommodate area control area by area in which the package light sources are connected in series.

FIG. 14 illustrates a structure in which four package light sources are connected in series in the longitudinal direction of the printed circuit board and the four package light sources as a unit are periodically and repeatedly provided. As illustrated in FIG. 14, because the thermal via metal films of the package light sources are connected to the copper thin films 12 for heat radiation of the printed circuit board, heat generated at the elements is radiated by heat conduction through the thermal via metal films to the copper thin films 12 for heat radiation. Heat radiated from the plurality of packages is transported by heat conduction and thermal diffusion to the upside of the copper thin films 12 for heat radiation, and further, radiated to the upside of the printed circuit board. Heat is selectively radiated mainly at both sides of the printed circuit board. With regard to electricity, electrical connection is made inside the printed circuit board through the wiring 13 for conducting current to the driver IC, the resistance, and the capacitor, and circuits for operating the elements are formed. This makes it possible to separate a heat transport region for heat radiation and an electrical connection operation region on the printed circuit board.

Figure 15:
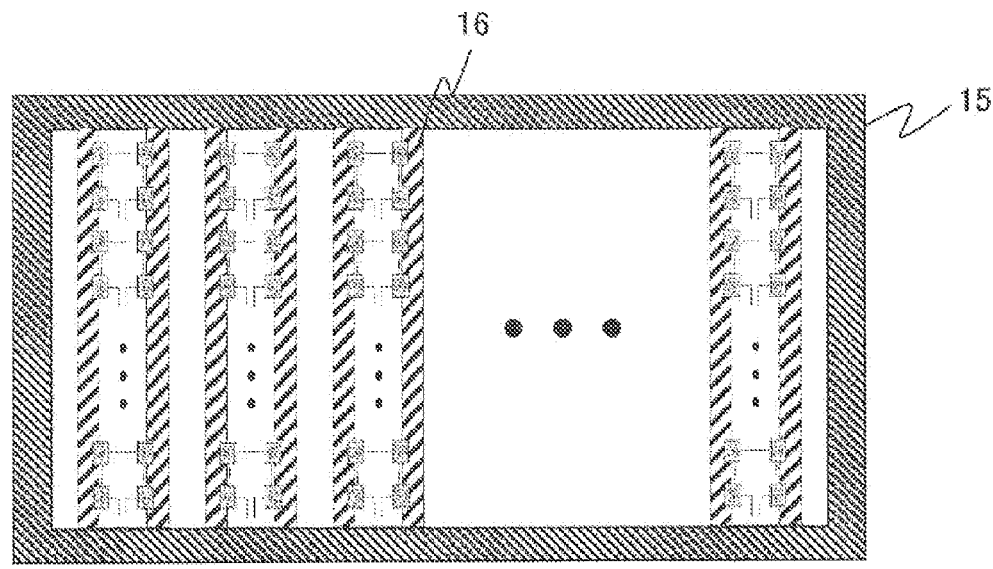
FIG. 15 is a top view illustrating an exemplary structure of the printed circuit boards accommodating the backlight device according to the first embodiment of the present invention and a housing frame.

In FIG. 15, a plurality of printed circuit board modules 16 each of which has a plurality of package light sources mounted thereon are fixed to a metal housing frame 15 for a backlight, and a whole backlight module is formed. Here, the copper thin films 12 for heat radiation of the printed circuit board modules 16 are fixed by screws using a high heat conduction adhesive sheet or the like so as to be in contact with the metal housing frame, thereby radiating heat to the metal housing frame 15, and at the same time, securing mechanical strength. Heat radiation to the upside of the metal housing frame 15 results in heat radiation to the atmosphere. In order to radiate heat and lower the temperature thereof further, a fin structure for heat radiation may be provided above the metal housing frame 15.

By determining the length and the number of the printed circuit board modules 16 to be mounted on the housing so as to be appropriate for a large liquid crystal display device, the backlight source modules can be applied to a display device of an arbitrary size.

Figure 16:
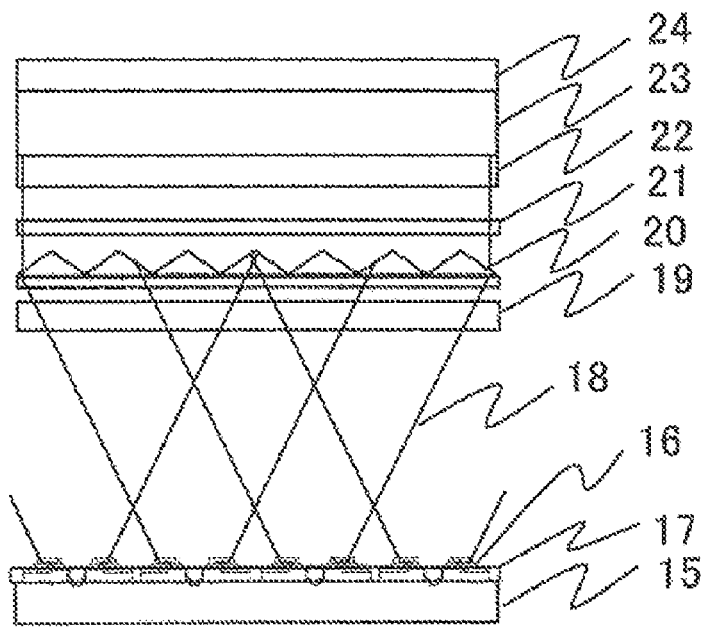
FIG. 16 is a sectional view illustrating an exemplary liquid crystal display device according to the first embodiment of the present invention.

The backlight source modules according to this embodiment are applied and an optical system is formed to accommodate a large liquid crystal display device. As illustrated in FIG. 16, the printed circuit board modules 16 are mounted on the backlight metal housing frame 15, and the portion other than the package light sources is covered with an optical reflection sheet 17.

Light beams 18 emitted from the backlight source modules pass through a diffuser plate 19, a prism sheet 20, a polarizing reflection sheet 21, and a liquid crystal display panel. The liquid crystal display panel includes a pair of glass substrates, a liquid crystal layer 23 disposed between the pair of glass substrates, and a lower polarizing plate 22 and an upper polarizing plate 24 provided for the respective glass substrates.

Although omitted in FIG. 16, the liquid crystal display panel has a plurality of scanning lines disposed in a lateral direction of a display surface, a plurality of signal lines disposed orthogonally to the plurality of scanning lines, that is, in a longitudinal direction of the display surface, and a plurality of switching elements disposed at intersections of the plurality of scanning lines and the plurality of signal lines. Here, by designing and controlling radiation angle distribution according to the distance between the package light sources and the diffuser plate, uniformity of brightness distribution and chromaticity distribution of the backlight source modules can be improved.

Figure 17:
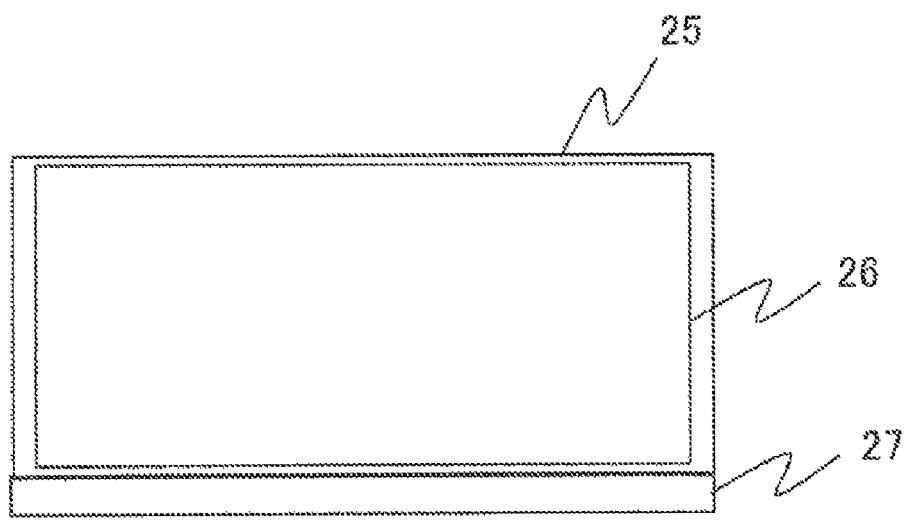
FIG. 17 is a top view illustrating the exemplary liquid crystal display device according to the first embodiment of the present invention.
Figure 18:
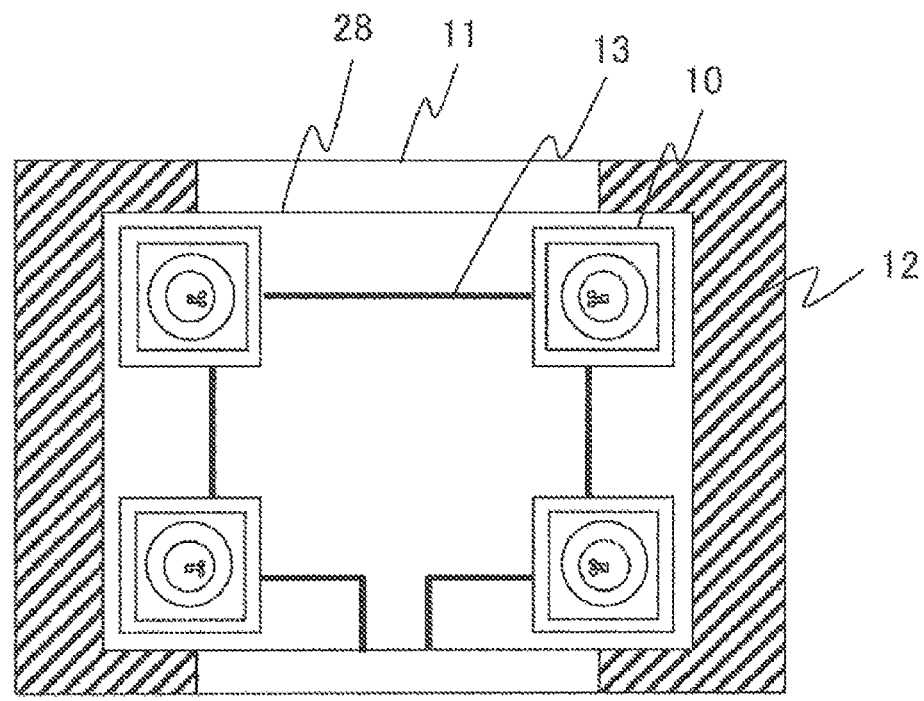
FIG. 18 is a top view illustrating an exemplary printed circuit board having package light sources mounted thereon according to a second embodiment of the present invention.
Figure 19:
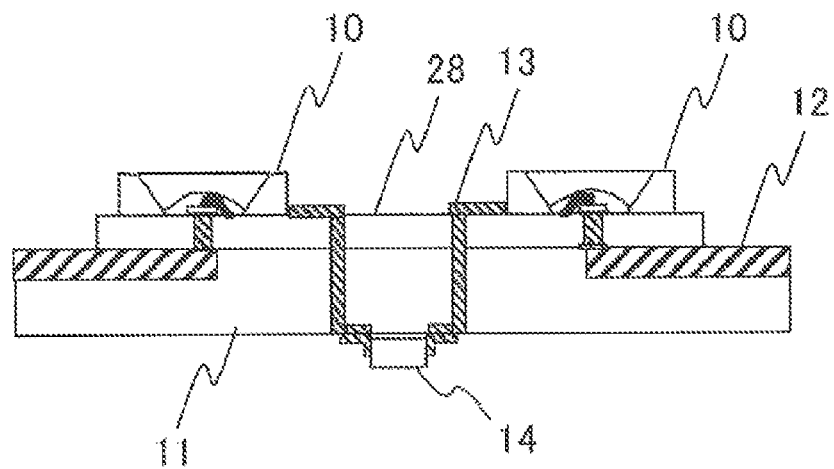
FIG. 19 is a sectional view illustrating the exemplary printed circuit board having the package light sources according to the second embodiment of the present invention.

FIG. 17 illustrates a structure of a backlight housing 25, a liquid crystal display panel module 26 including a backlight module and an optical system, and a drive circuit 27.

In this embodiment, by adjusting the number of the package light sources and the size of the printed circuit board according to the size of the liquid crystal display device and making the backlight module function, necessary uniformity of brightness distribution and chromaticity distribution can be secured. The white backlight source module structure according to this embodiment may be applied not only to a backlight source module of a large liquid crystal display device but also to a backlight source module for a liquid crystal panel for a personal computer or an in-car navigation system or to other car-mounted light source modules.

[Second Embodiment]

A second embodiment of the present invention is now described with reference to FIGS. 18 to 23.

Similarly to the case of the first embodiment of the present invention, the backlight source modules are manufactured to form a structure which corresponds to the structure illustrated in FIGS. 13 and 14. Here, the four package light sources 10 are connected in series and mounted on a ceramic substrate 28 to form the structure illustrated in FIGS. 18 and 19. Wiring lines, which connect the packages, are formed collectively by printing the wiring lines on the ceramic substrate. Electrical connection between the packages is made on the ceramic substrate 28. Connection to the driver IC 14, the resistance, and the capacitor is made on the rear surface side of the printed circuit board by way of the through holes. The structure for heat radiation is manufactured similarly to that in the first embodiment of the present invention. These make it possible to clearly separate the electrical connection region and a circuit region from the heat radiation region and to suppress influence of mutual interference.

Change in the characteristics as the temperature changes was studied with regard to the four package light sources connected in series by wiring on the printed circuit board 11 which has the heat radiation region as the copper thin films 12. It was revealed that, compared with a case in which connection was made to a conventional printed circuit board without a heat radiation region, change in the optical characteristics as the temperature changes could be suppressed.

Figure 20:
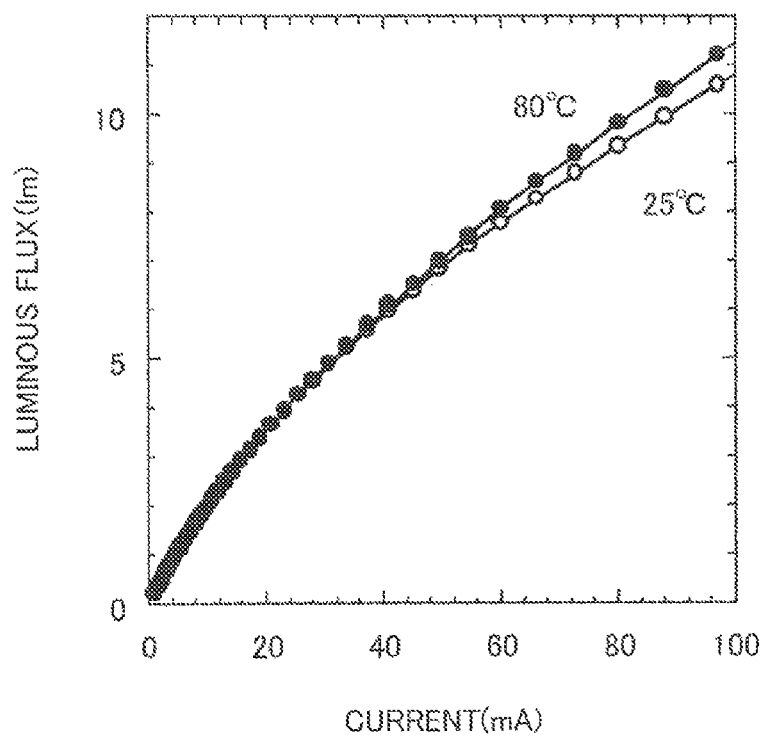
FIG. 20 is a graph illustrating current-luminous flux characteristics by temperature of a package light source blue element mounted on a printed circuit board without a heat radiation structure of the conventional art.
Figure 21:
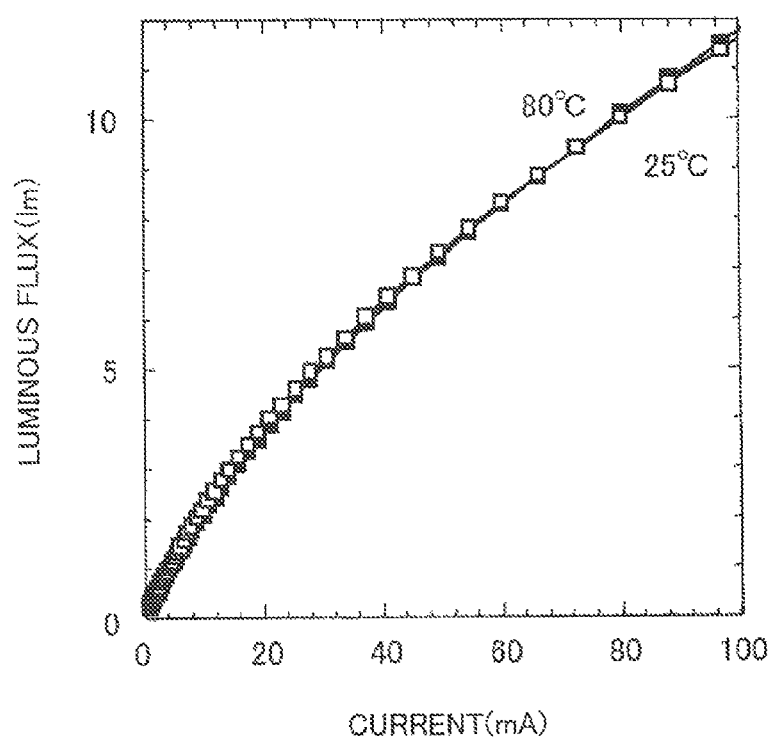
FIG. 21 is a graph illustrating current-luminous flux characteristics by temperature of the package light source blue element mounted on a printed circuit board with a heat radiation structure according to the second embodiment of the present invention.

FIG. 20 illustrates current-luminous flux characteristics of only a blue LED element mounted on a package which is connected to a conventional printed circuit board without a heat radiation region. FIG. 21 illustrates current-luminous flux characteristics of only a blue LED element similarly mounted on a package which is connected to the printed circuit board with the heat radiation region according to this embodiment.

The dependence of current-luminous flux characteristics on temperature is compared between FIG. 20 and FIG. 21. On the conventional printed circuit board without a heat radiation region, when the current is 40-50 mA or larger, there is a clear difference between the data when the temperature is 25° C. and the data when the temperature is 80° C. It is clear that the current-luminous flux characteristics depend on temperature. This means that, on the conventional printed circuit board in which a satisfactory heat radiation structure is not formed, effective temperature of the element is increased. Meanwhile, on the printed circuit board with the heat radiation region according to this embodiment, even when the temperature changes from 25° C. to 80° C., there is almost no change in the current-luminous flux characteristics. This means that, in this embodiment, change as the temperature changes is suppressed to a large extent, there is almost no interference of temperature among the packages, and independent operation control can be exercised.

Figure 22:
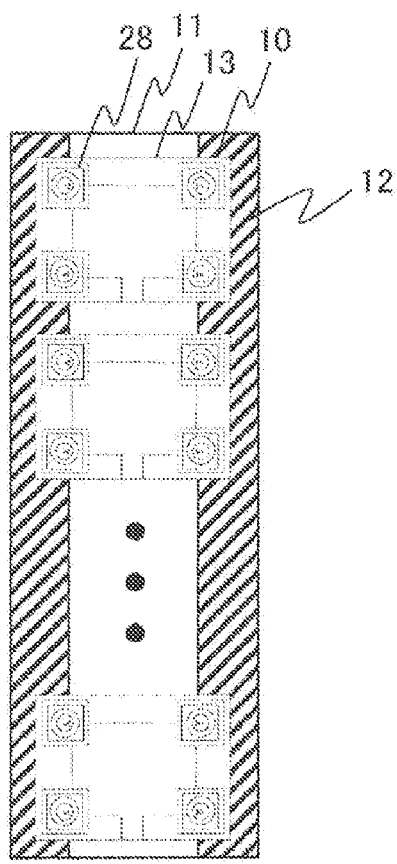
FIG. 22 is a top view illustrating an exemplary structure of a printed circuit board accommodating a backlight device according to the second embodiment of the present invention.
Figure 23:
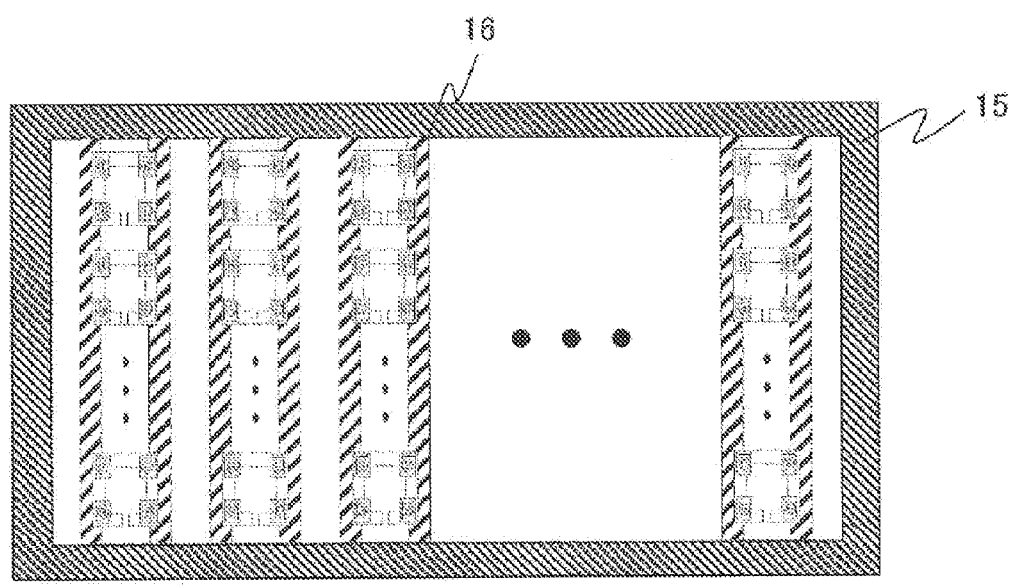
FIG. 23 is a top view illustrating an exemplary structure of the printed circuit boards accommodating the backlight device according to the second embodiment of the present invention and a housing frame.

Similarly to the case of the first embodiment of the present invention, as illustrated in FIGS. 22 and 23, the backlight source modules are manufactured.

FIG. 22 illustrates a structure in which four package light sources are connected in series in the longitudinal direction of the printed circuit board and are mounted on the ceramic substrate 28, and the ceramic substrate 28 as a unit is periodically and repeatedly provided.

As illustrated in FIG. 22, because the thermal via metal films of the package light sources are connected to the copper thin films 12 for heat radiation of the printed circuit board, heat generated at the elements is radiated by heat conduction through the packages and the thermal via metal films of the ceramic substrates to the copper thin films 12 for heat radiation. Heat radiated from the plurality of packages and the plurality of ceramic substrates is transported by heat conduction and thermal diffusion to the upside of the copper thin films 12 for heat radiation, and further, radiated to the upside of the printed circuit board. Heat is selectively radiated mainly at both sides of the printed circuit board. With regard to electricity, electrical connection is made inside the printed circuit board through the wiring 13 for conducting current to the driver IC, the resistance, and the capacitor, and circuits for operating the elements are formed.

This makes it possible to separate a heat transport region for heat radiation and an electrical connection operation region on the printed circuit board.

In FIG. 23, a plurality of printed circuit board modules 16 each of which has a plurality of package light sources mounted thereon are fixed to a metal housing frame 15 for a backlight, and a whole backlight module is formed. Here, the copper thin films 12 for heat radiation of the printed circuit board modules 16 are fixed by screws using a high heat conduction adhesive sheet or the like so as to be in contact with the metal housing frame, thereby radiating heat to the metal housing frame 15, and at the same time, securing mechanical strength. Heat radiation to the upside of the metal housing frame 15 results in heat radiation to the atmosphere.

In order to radiate heat and lower the temperature thereof further, a fin structure for heat radiation may be provided above the metal housing frame 15. Similarly to the case of the first embodiment of the present invention, an optical system is formed and the backlight source modules according to this embodiment is applied to manufacture a large liquid crystal display device. By determining the length and the number of the printed circuit board modules 16 to be mounted on the housing so as to be appropriate for a large liquid crystal display device, the backlight source modules can be applied to a display device of an arbitrary size.

In this embodiment, by adjusting the number of the package light sources and the size of the printed circuit board according to the size of the liquid crystal display device and making the backlight module function, necessary uniformity of brightness distribution and chromaticity distribution can be secured. The driving of the backlight source which accommodates area control can be controlled with the plurality of package light sources mounted on the ceramic substrate being a unit. The white backlight source module structure according to this embodiment may be applied not only to a backlight source module of a large liquid crystal display device but also to a backlight source module for a liquid crystal panel for a personal computer or an in-car navigation system or to other car-mounted light source modules.

[Third Embodiment]

A third embodiment of the present invention is now described with reference to FIGS. 24 to 32.

Figure 24:
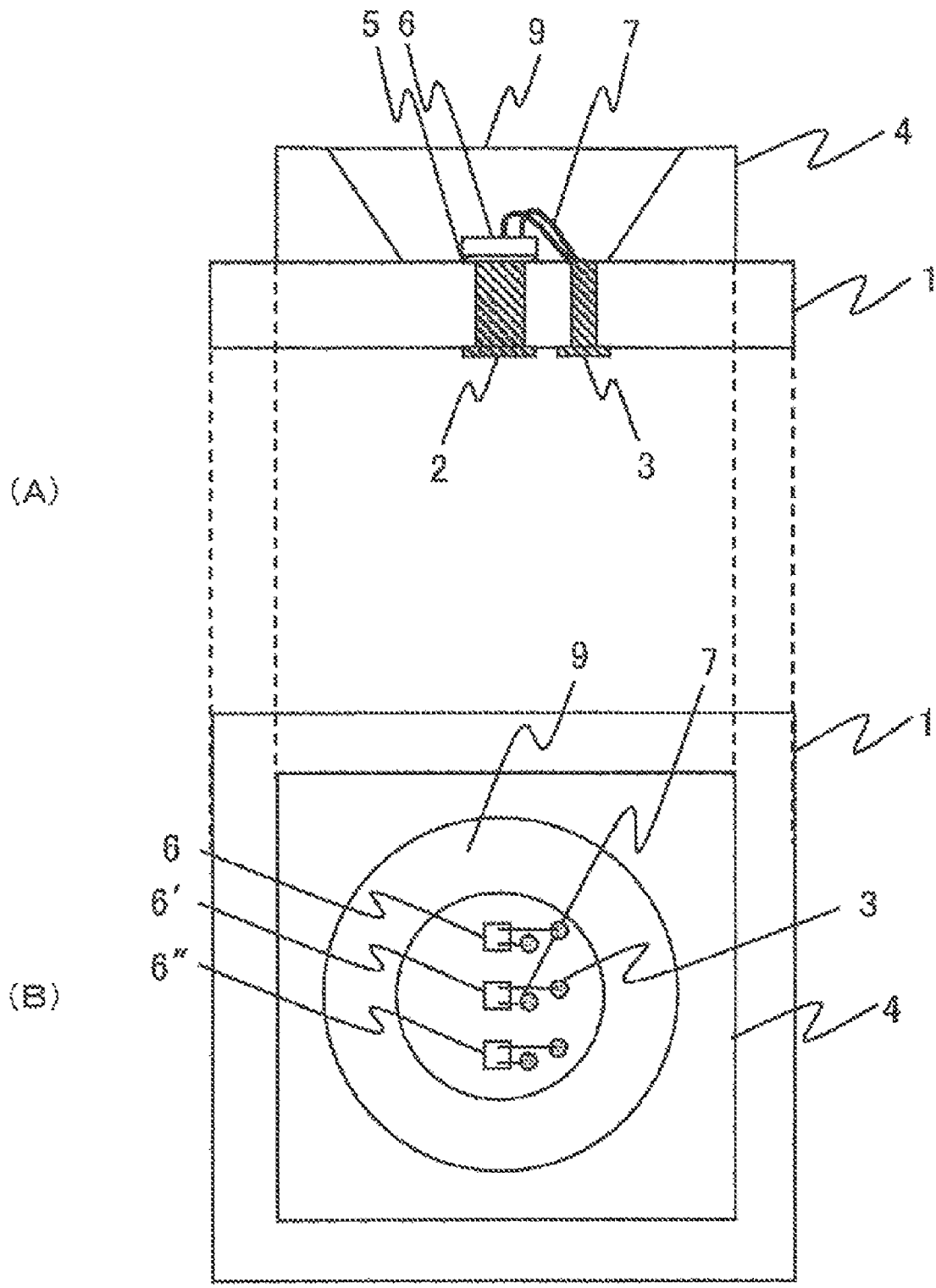
FIGS. 24 illustrate an exemplary package light source of a backlight device according to a third embodiment of the present invention.

In this embodiment, as a package light source, LED elements of RGB (red, green, and blue) are mounted. FIG. 24 illustrates a structure in section of the package in part (A) and illustrates a structure seen from the top of the package having the RGB elements mounted thereon in part (B). With regard to each of the RGB elements, the metal region 2 for heat radiation and the two metal regions 3 for conducting current are formed in the ceramic substrate 1. After the reflector plate 4 is provided thereabove, the two-wire-type blue LED element 6, a two-wire-type red LED element 6', and a two-wire-type green LED element 6" are mounted on the metal region 2 for heat radiation using the die bonding material 5. Further, each of the RGB elements is connected to the two metal regions 3 for conducting current by the gold wire 7. After that, the transparent resin 9 is used for sealing to obtain the RGB light source. Here, as illustrated in FIGS. 24, the two metal regions 3 for conducting current are provided only on one side of the element. This accommodates a structure for separating the electrical connection region and the heat radiation region of the element.

Figure 25:
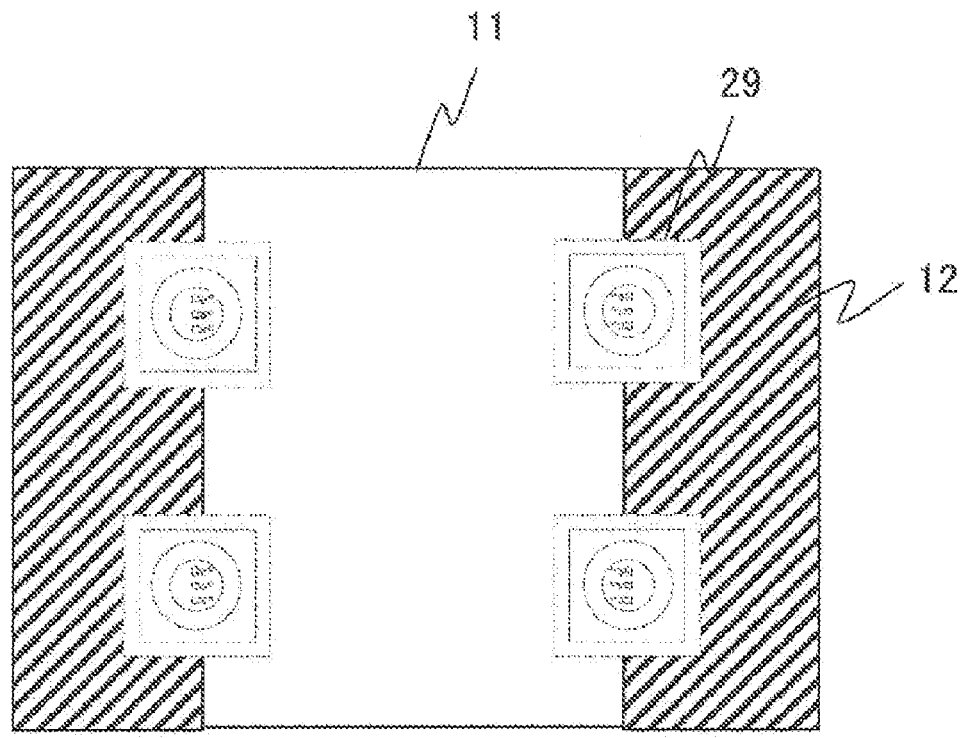
FIG. 25 is a top view illustrating an exemplary printed circuit board having the package light sources mounted thereon according to the third embodiment of the present invention.
Figure 26:
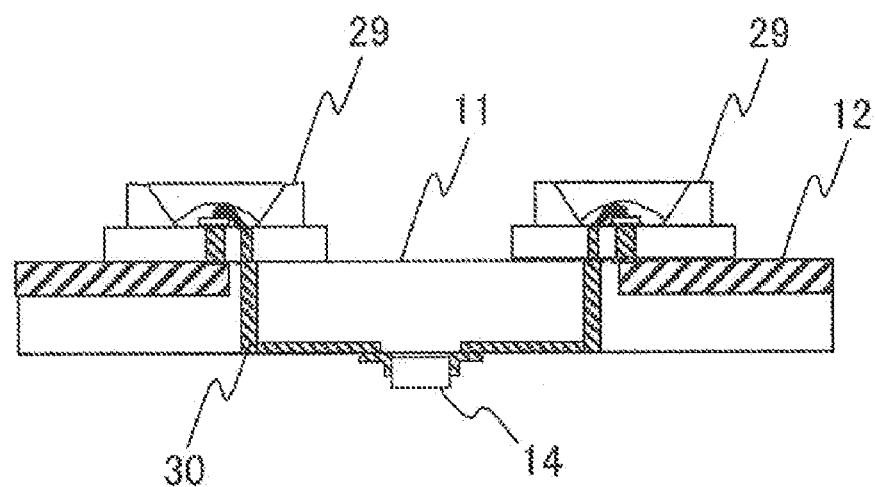
FIG. 26 is a sectional view illustrating the exemplary printed circuit board having the package light sources mounted thereon according to the third embodiment of the present invention.

Then, surface mount type package light sources illustrated in FIGS. 25 and 26 are mounted on the printed circuit board 11. FIGS. 25 and 26 illustrate a part of the package light sources mounted on the printed circuit board. As illustrated in FIG. 25, manufactured RGB light source packages 29 are mounted on the printed circuit board 11. The copper thin films 12 for heat radiation are provided on both sides of the printed circuit board 11.

As illustrated in FIG. 26, the copper thin films 12 and the wiring 13 for conducting current are in advance provided for the printed circuit board 11 to make connection to the metal region 2 for heat radiation and to the two metal regions 3 for conducting current, respectively, of the package, and the connection is made using a solder paste or the like. Wiring 30 for conducting current is provided so as to correspond to a rear surface of the printed circuit board 11 and is adapted to be connected to the multi-channel driver IC 14 for controlling operation of the package light sources. Here, a resistance and a capacitor are also mounted for stable operation. In this embodiment, the wiring is connected to the multi-channel driver IC 14 such that the package light sources are individually operated.

By the structure described above, the LED elements in the packages and the driver IC element can be electrically connected with each other within an inside region of the printed circuit board to be operated. Further, heat generated at the LED elements in the packages can be radiated by thermal diffusion to both outer sides of the printed circuit board through the thermal via holes for heat radiation and through the copper thin films for radiating heat from the printed circuit board.

These make it possible to provide a structure in which the connection for conducting current and the connection for heat radiation are made to each of the RGB elements as light sources such that the electrical connection region and the heat radiation region are separated.

The present package light sources can be connected in series through the wiring on the printed circuit board. Further, because the backlight sources are controlled area by area, it is also possible to control the operation of a plurality of serially connected package light sources which accommodate area control.

Figure 27:
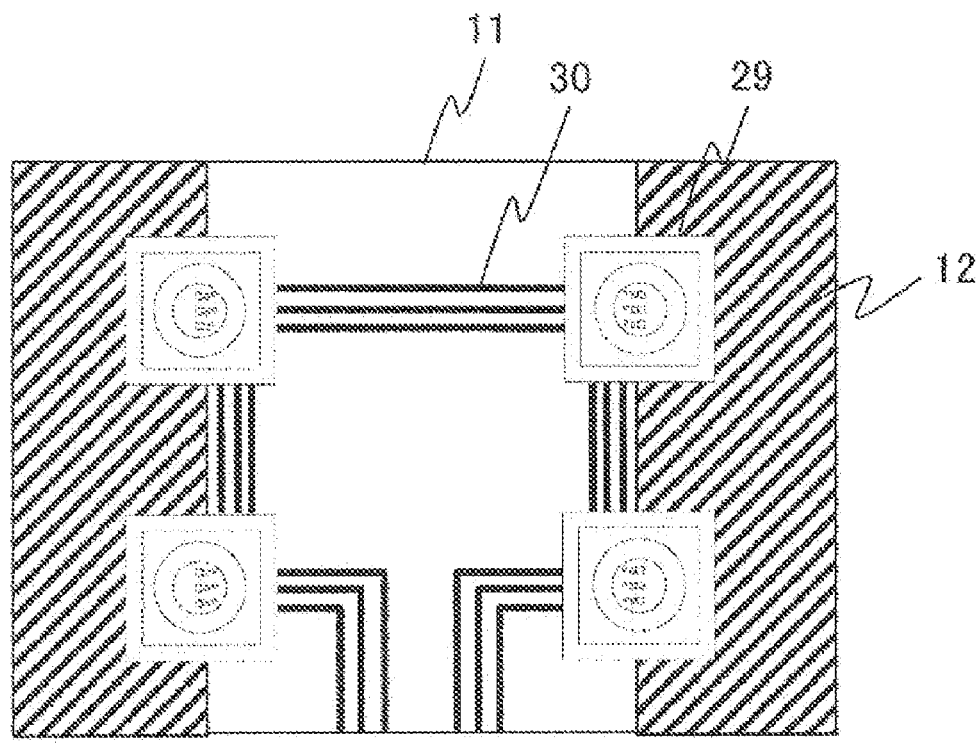
FIG. 27 is a top view illustrating another exemplary printed circuit board having the package light sources mounted thereon according to the third embodiment of the present invention.
Figure 28:
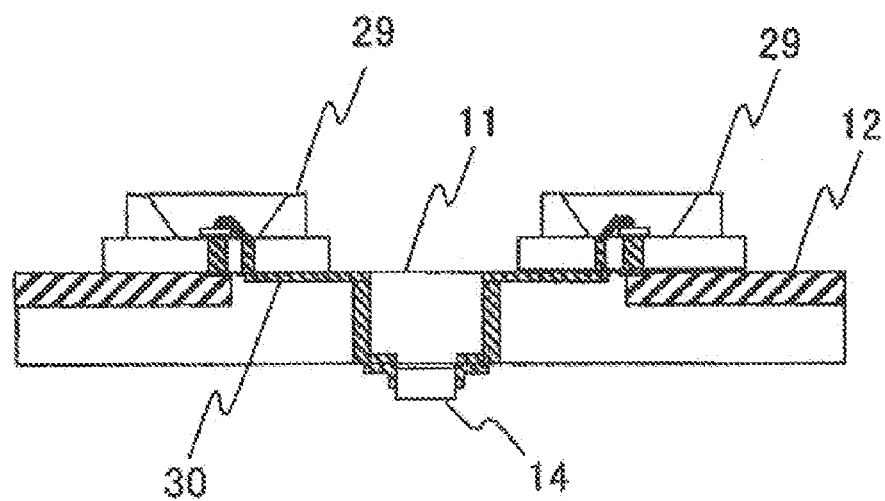
FIG. 28 is a sectional view illustrating the another exemplary printed circuit board having the package light sources mounted thereon according to the third embodiment of the present invention.

FIGS. 27 and 28 illustrate a structure in which four RGB element package light sources are connected in series. The RGB element package light sources may be connected in series through wiring on the front surface side or wiring on the rear surface side of the printed circuit board 11. As illustrated in FIG. 28, the multi-channel driver IC 14 is connected so as to accommodate four package light sources connected in series and connected to the respective RGB elements, whereby the multi-channel driver IC 14 can control the operation of the package light sources. This makes it possible to drive package light sources which accommodate area control area by area in which the package light sources are connected in series, and the RGB elements can be independently controlled.

Change in the characteristics as the temperature changes was studied with regard to the four RGB element package light sources connected in series by wiring on the printed circuit board 11 which has the heat radiation region as the copper thin films 12. It was revealed that, compared with a case in which connection was made to a conventional printed circuit board without a heat radiation region, change in the electrical characteristics and the optical characteristics as the temperature changes could be suppressed. Because, in particular, a red LED element is clearly more highly temperature-dependent, results of change in the electrical characteristics and the optical characteristics as the temperature changes with regard to a red LED element are described here as a representative example.

Figure 29:
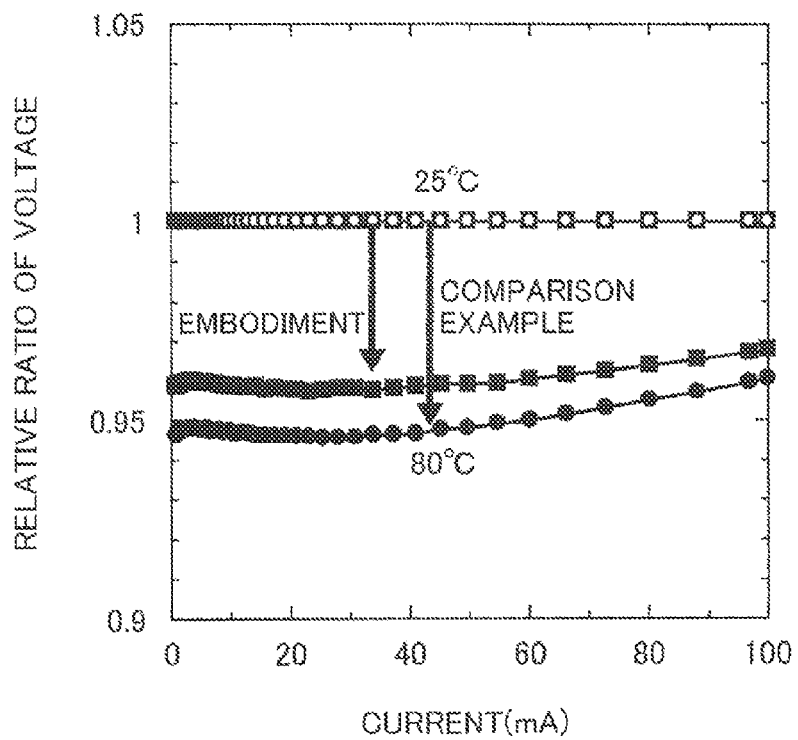
FIG. 29 is a graph illustrating relative ratio of voltage by temperature of a package light source red LED element mounted on a printed circuit board with or without a heat radiation structure.
Figure 30:
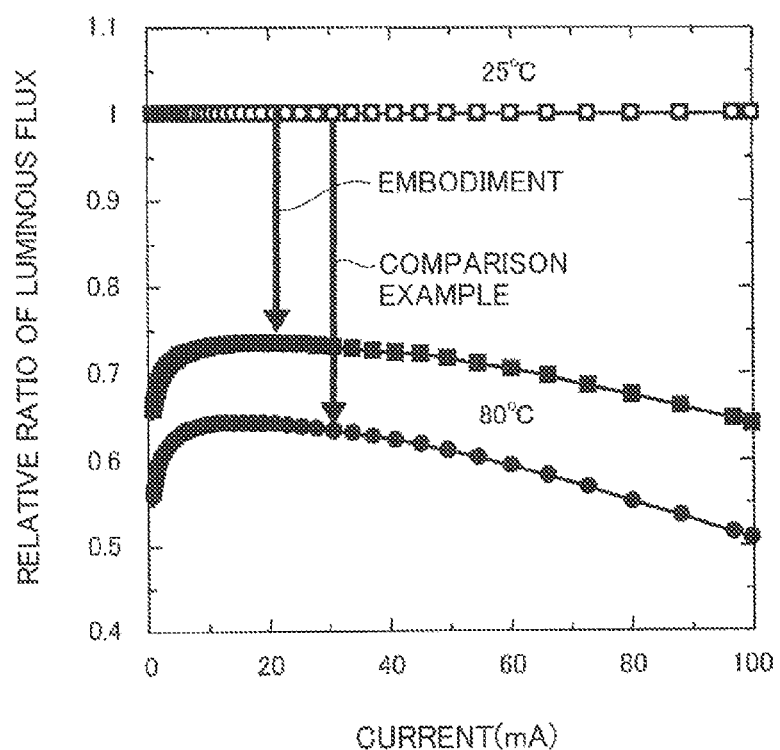
FIG. 30 is a graph illustrating relative ratio of luminous flux by temperature of the package light source red LED element mounted on a printed circuit board with or without a heat radiation structure.

FIG. 29 illustrates relative ratio of voltage of current-voltage characteristics of four red LED elements mounted on a package connected to a printed circuit board with or without a heat radiation region according to this embodiment. FIG. 30 illustrates relative ratio of luminous flux of current-luminous flux characteristics of only four red LED elements similarly mounted on a package connected to the printed circuit board with or without the heat radiation region according to this embodiment. Ordinarily, in general, when the temperature of a semiconductor element becomes higher, relative ratio of voltage and luminous flux in relation to room temperature becomes smaller with regard to a same current.

In FIG. 29, with data when the temperature is 25° C. being the reference, relative change is studied. When the temperature is 80° C., relative ratio of voltage on the conventional printed circuit board without a heat radiation region in the comparison example is smaller than that in the case of the printed circuit board with the heat radiation region according to this embodiment, and it is found that influence of temperature change is strong. This means that, on the conventional printed circuit board in which a satisfactory heat radiation structure is not formed, effective temperature of the element is increased. On the printed circuit board with a heat radiation structure according to this embodiment, heat radiation is thought to effectively suppress temperature rise of the element. The same can be said about the optical characteristics.

In FIG. 30, with data when the temperature is 25° C. being the reference, relative change is studied. When the temperature is 80° C., relative ratio of luminous flux on the conventional printed circuit board without a heat radiation region in the comparison example is smaller than that in the case of the printed circuit board with the heat radiation region according to this embodiment, and it is found that influence of temperature change is strong. The structure with a heat radiation region according to the present invention is clearly advantageous in controlling change in the characteristics of the element as the temperature changes, because change in the characteristics as the temperature changes is small. This is also an important result from the viewpoint of feedback control of the driving.

Figure 31:
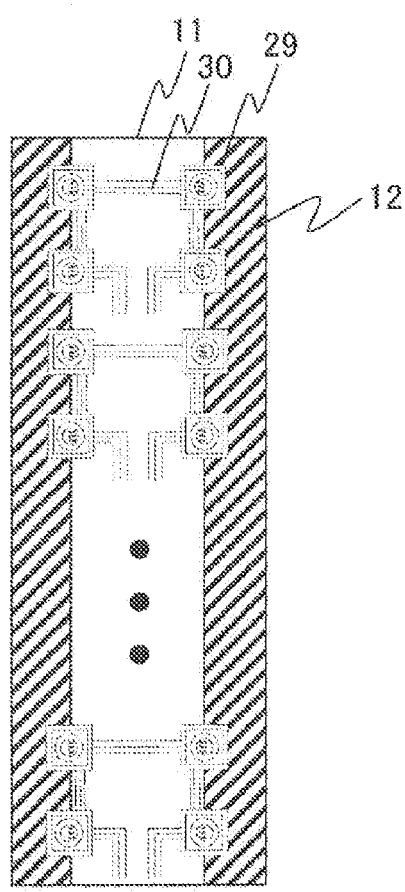
FIG. 31 is a top view illustrating an exemplary structure of a printed circuit board accommodating the backlight device according to the third embodiment of the present invention.

FIG. 31 illustrates a structure in which four package light sources are connected in series in the longitudinal direction of the printed circuit board and the four package light sources as a unit are periodically and repeatedly provided. As illustrated in FIG. 31, because the thermal via metal films of the package light sources are connected to the copper thin films 12 for heat radiation of the printed circuit board, heat generated at the elements is radiated by heat conduction through the thermal via metal films to the copper thin films 12 for heat radiation.

Heat radiated from the plurality of packages is transported by heat conduction and thermal diffusion to the upside of the copper thin films 12 for heat radiation, and further, radiated to the upside of the printed circuit board. Heat is selectively radiated mainly at both sides of the printed circuit board. With regard to electricity, electrical connection is made inside the printed circuit board through the wiring 13 for conducting current to the driver IC, the resistance, and the capacitor, and circuits for operating the elements are formed. This makes it possible to separate a heat transport region for heat radiation and an electrical connection operation region on the printed circuit board.

Figure 32:
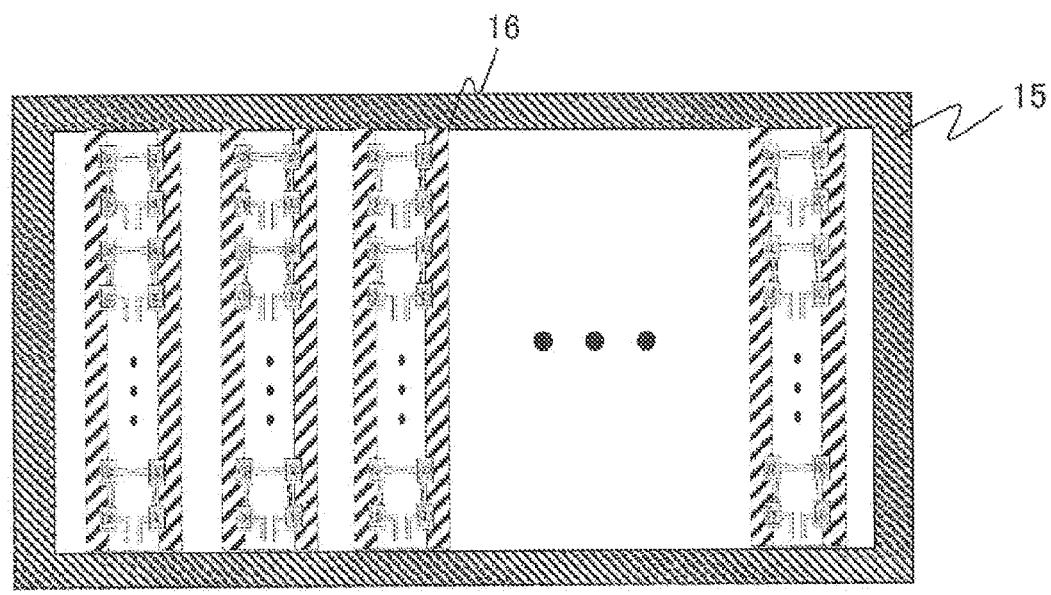
FIG. 32 is a top view illustrating an exemplary structure of the printed circuit boards accommodating the backlight device according to the third embodiment of the present invention and a housing frame.

In FIG. 32, a plurality of printed circuit board modules 16 each of which has a plurality of package light sources mounted thereon are fixed to a metal housing frame 15 for a backlight, and a whole backlight module is formed. Here, the copper thin films 12 for heat radiation of the printed circuit board modules 16 are fixed by screws using a high heat conduction adhesive sheet or the like so as to be in contact with the metal housing frame, thereby radiating heat to the metal housing frame 15, and at the same time, securing mechanical strength. Heat radiation to the upside of the metal housing frame 15 results in heat radiation to the atmosphere. In order to radiate heat and lower the temperature thereof further, a fin structure for heat radiation may be provided above the metal housing frame 15.

Similarly to the case of the first embodiment of the present invention, an optical system is formed and the backlight source modules according to this embodiment is applied to manufacture a large liquid crystal display device. By determining the length and the number of the printed circuit board modules 16 to be mounted on the housing so as to be appropriate for a large liquid crystal display device, the backlight source modules can be applied to a display device of an arbitrary size.

In this embodiment, by adjusting the number of the package light sources and the size of the printed circuit board according to the size of the liquid crystal display device and making the backlight module function, necessary uniformity of brightness distribution and chromaticity distribution can be secured. By independently controlling the RGB light sources of the plurality of package light sources, a primary color can be reproduced with good uniformity. By controlling operating conditions of the RGB light sources and adjusting the chromaticity in color mixture, the light can also be made to function as white light as a whole.

With regard to the application, similarly to the cases of the first and second embodiments of the present invention, the backlight module structure adjusted by the RGB light sources according to this embodiment may be applied not only to a backlight source module of a large liquid crystal display device but also to a backlight source module for a liquid crystal panel for a personal computer or an in-car navigation system or to other car-mounted light source modules.

[Fourth Embodiment]

A fourth embodiment of the present invention is now described with reference to FIGS. 33 to 38.

Figure 33:
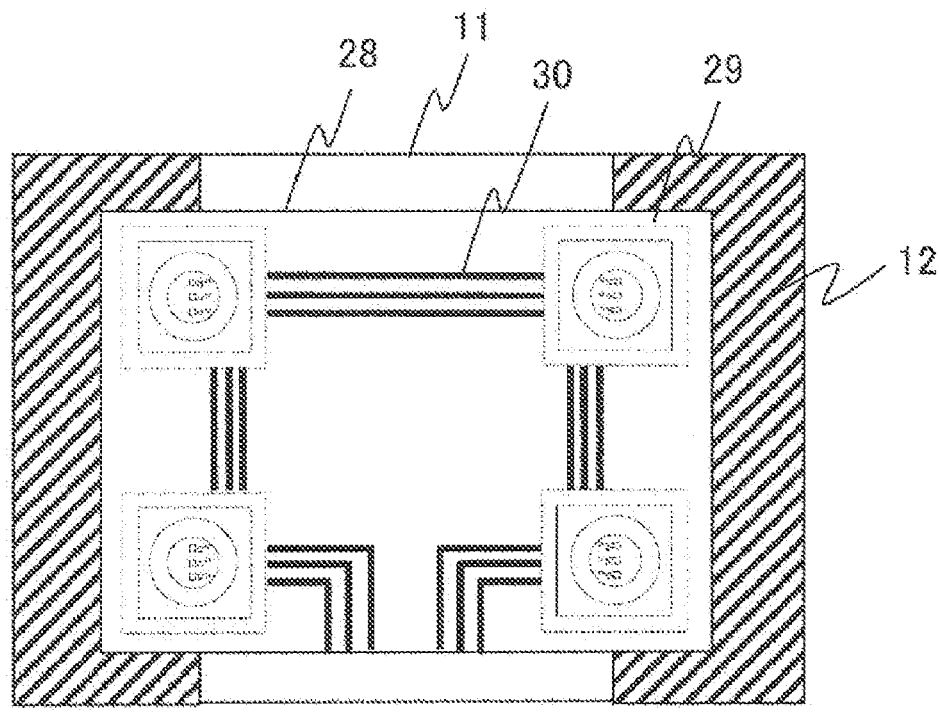
FIG. 33 is a top view illustrating an exemplary printed circuit board having package light sources mounted thereon according to a fourth embodiment of the present invention.
Figure 34:
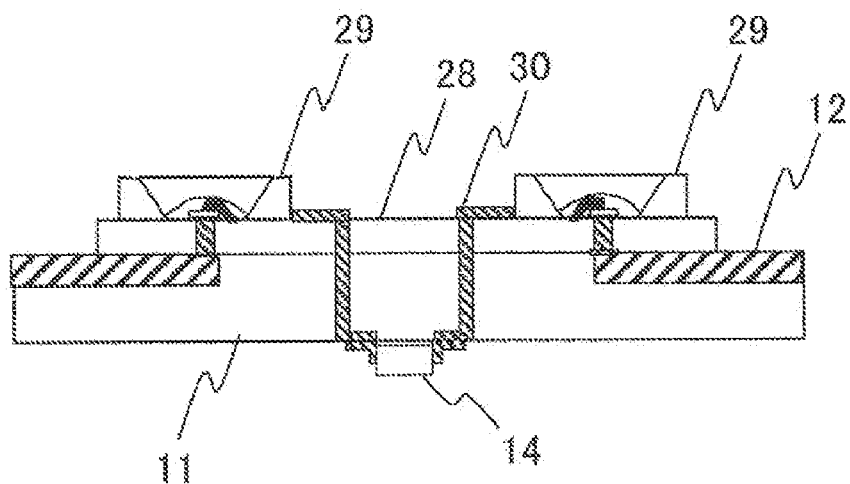
FIG. 34 is a sectional view illustrating the exemplary printed circuit board having the package light sources mounted thereon according to the fourth embodiment of the present invention.

In this embodiment, the RGB LED elements are directly mounted on the ceramic substrate having wiring printed thereon. As illustrated in FIGS. 33 and 34, four RGB light source packages 29 each having the RGB elements directly mounted thereon and a reflector provided therewith are provided on the ceramic substrate 28 and the four sets of RGB elements are connected in series by wiring. The ceramic substrate 28 is mounted on the printed circuit board 11. The wiring which connects the RGB light source packages 29 are formed collectively by printing the wiring on the ceramic substrate. Electrical connection is made on the ceramic substrate 28. Connection to the driver IC 14, the resistance, and the capacitor is made on the rear surface side of the printed circuit board by way of the through holes.

The structure for heat radiation is manufactured similarly to that in the second embodiment of the present invention. These make it possible to clearly separate the electrical connection region and a circuit region from the heat radiation region and to suppress influence of mutual interference.

Change in the characteristics as the temperature changes was studied with regard to the four directly mounted regions (RGB light source packages 28) connected in series by wiring on the printed circuit board 11 which has the heat radiation region as the copper thin films 12. It was revealed that, compared with a case in which connection was made to a conventional printed circuit board without a heat radiation region, change in the electrical characteristics and the optical characteristics as the temperature changes could be suppressed. Because, in particular, a red LED element is clearly more highly temperature-dependent, results of change in the electrical characteristics and the optical characteristics as the temperature changes with regard to a red LED element are described here as a representative example.

Figure 35:
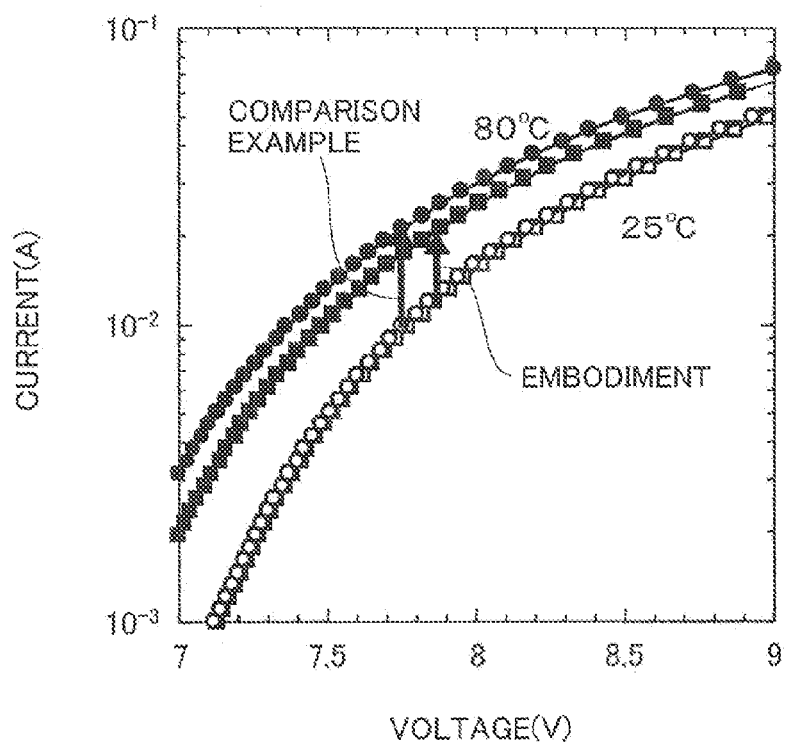
FIG. 35 is a graph illustrating current-voltage characteristics by temperature of a package light source red element mounted on a printed circuit board with and without a heat radiation structure according to the fourth embodiment of the present invention.
Figure 36:
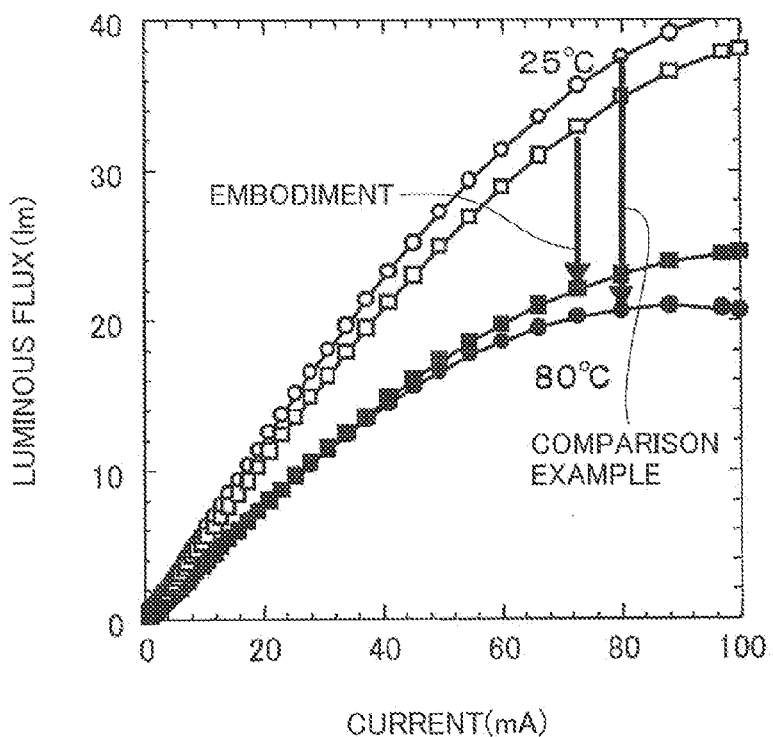
FIG. 36 is a graph illustrating current-luminous flux characteristics by temperature of the package light source red element mounted on the printed circuit board with and without the heat radiation structure according to the fourth embodiment of the present invention.

FIG. 35 illustrates change in the current-voltage characteristics as the temperature changes of the four red LED elements when connection is made to a conventional printed circuit board without a heat radiation region and when connection is made to the printed circuit board with the heat radiation region according to this embodiment. FIG. 36 illustrates change in the current-luminous flux characteristics as the temperature changes of the four red LED elements on a printed circuit board with or without a heat radiation region. Ordinarily, in general, when the temperature of a semiconductor element becomes higher, current increase with regard to a same voltage becomes larger and current change in relation to room temperature becomes larger.

In FIG. 35, relative change between 25° C. and 80° C. is studied. When the temperature is 80° C., current increase on the conventional printed circuit board without a heat radiation region in the comparison example is larger than that in the case of the printed circuit board with the heat radiation region according to this embodiment, and it is found that influence of temperature change is strong. This means that, on the conventional printed circuit board in which a satisfactory heat radiation structure is not formed, effective temperature of the element is increased. On the printed circuit board with a heat radiation structure according to this embodiment, heat radiation is thought to effectively suppress temperature rise of the element. The same can be said about the optical characteristics.

In FIG. 36, relative change between 25° C. and 80° C. is studied. When the temperature is 80° C., decrease rate of luminous flux on the conventional printed circuit board without the heat radiation region in the comparison example is larger than that in the case of the printed circuit board with the heat radiation region according to present embodiment, and it is found that influence of temperature change is strong. The structure with a heat radiation region according to the present invention is clearly advantageous in controlling change in the characteristics of the element as the temperature changes, because change in the characteristics as the temperature changes is small. This is also an important result from the viewpoint of feedback control of the driving.

Figure 37:
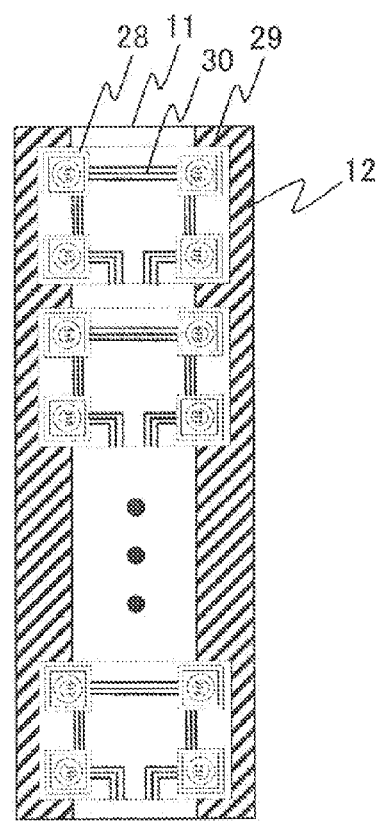
FIG. 37 is a top view illustrating an exemplary structure of a printed circuit board accommodating a backlight device according to the fourth embodiment of the present invention.

FIG. 37 illustrates a structure in which directly mounted four RGB elements are connected in series in the longitudinal direction of the printed circuit board and are periodically and repeatedly provided. Because the thermal via metal films of the package light sources are connected to the copper thin films 12 for heat radiation of the printed circuit board, heat generated at the elements is radiated by heat conduction through the thermal via metal films to the copper thin films 12 for heat radiation. Heat radiated from the plurality of packages is transported by heat conduction and thermal diffusion to the upside of the copper thin films 12 for heat radiation, and further, radiated to the upside of the printed circuit board. Heat is selectively radiated mainly at both sides of the printed circuit board.

With regard to electricity, electrical connection is made inside the printed circuit board through the wiring 13 for conducting current to the driver IC, the resistance, and the capacitor, and circuits for operating the elements are formed. This makes it possible to separate a heat transport region for heat radiation and an electrical connection operation region on the printed circuit board.

Figure 38:
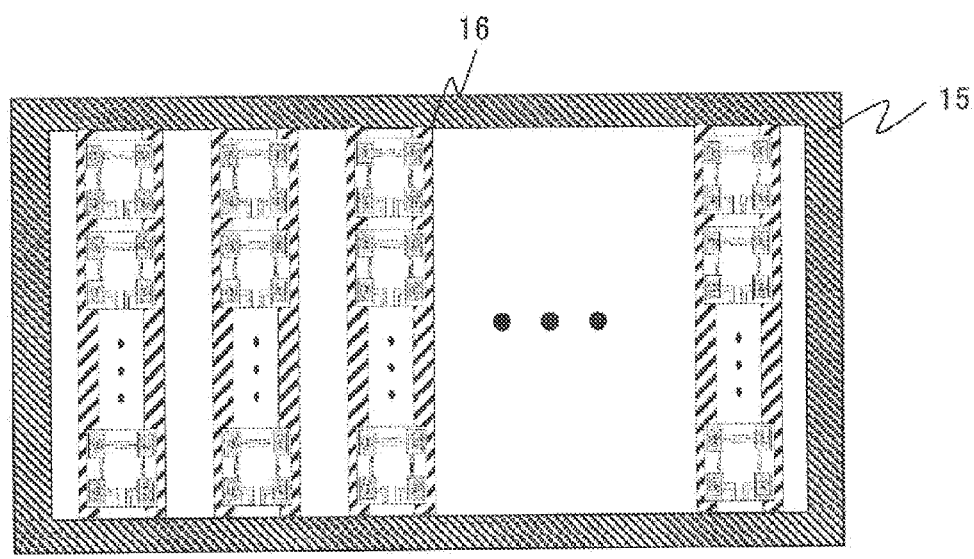
FIG. 38 is a top view illustrating an exemplary structure of the printed circuit boards accommodating the backlight device according to the fourth embodiment of the present invention and a housing frame.

In FIG. 38, a plurality of printed circuit board modules 16 each of which has a plurality of package light sources mounted thereon are fixed to a metal housing frame 15 for a backlight, and a whole backlight module is formed. Here, the copper thin films 12 for heat radiation of the printed circuit board modules 16 are fixed by screws using a high heat conduction adhesive sheet or the like so as to be in contact with the metal housing frame, thereby radiating heat to the metal housing frame 15, and at the same time, securing mechanical strength. Heat radiation to the upside of the metal housing frame 15 results in heat radiation to the atmosphere. In order to radiate heat and lower the temperature thereof further, a fin structure for heat radiation may be provided above the metal housing frame 15.

Similarly to the case of the first embodiment of the present invention, an optical system is formed and the backlight source modules according to this embodiment is applied to manufacture a large liquid crystal display device. By determining the length and the number of the printed circuit board modules 16 to be mounted on the housing so as to be appropriate for a large liquid crystal display device, the backlight source modules can be applied to a display device of an arbitrary size.

In this embodiment, by adjusting the number of the package light sources and the size of the printed circuit board according to the size of the liquid crystal display device and making the backlight module function, necessary uniformity of brightness distribution and chromaticity distribution can be secured. By independently controlling the plurality of RGB light sources, a primary color can be reproduced with good uniformity. By controlling operating conditions of the RGB light sources and adjusting the chromaticity in color mixture, the light can also be made to function as white light as a whole.

Further, the driving of the backlight source which accommodates area control can be controlled with the plurality of RGB light sources being a unit. The backlight module structure adjusted by the RGB light sources according to this embodiment may be applied not only to a backlight source module of a large liquid crystal display device but also to a backlight source module for a liquid crystal panel for a personal computer or an in-car navigation system or to other car-mounted light source modules.

[Fifth Embodiment]

Figure 39:
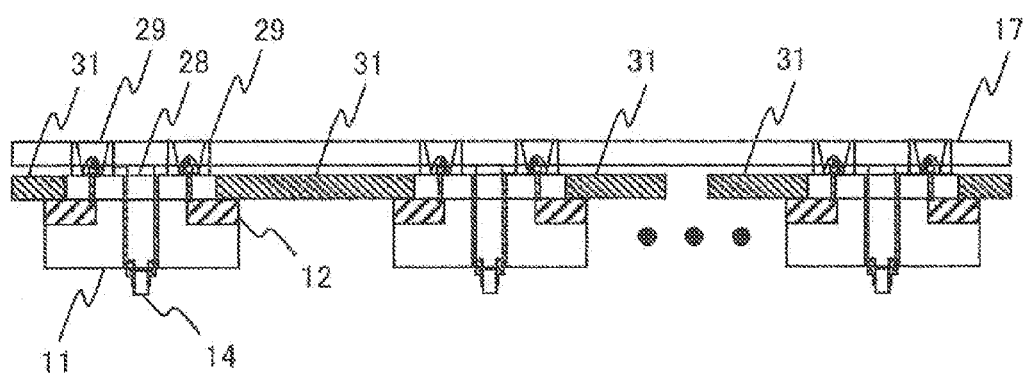
FIG. 39 is a sectional view illustrating an exemplary printed circuit board accommodating a backlight device according to a fifth embodiment of the present invention and a heat radiation sheet.
Figure 40:
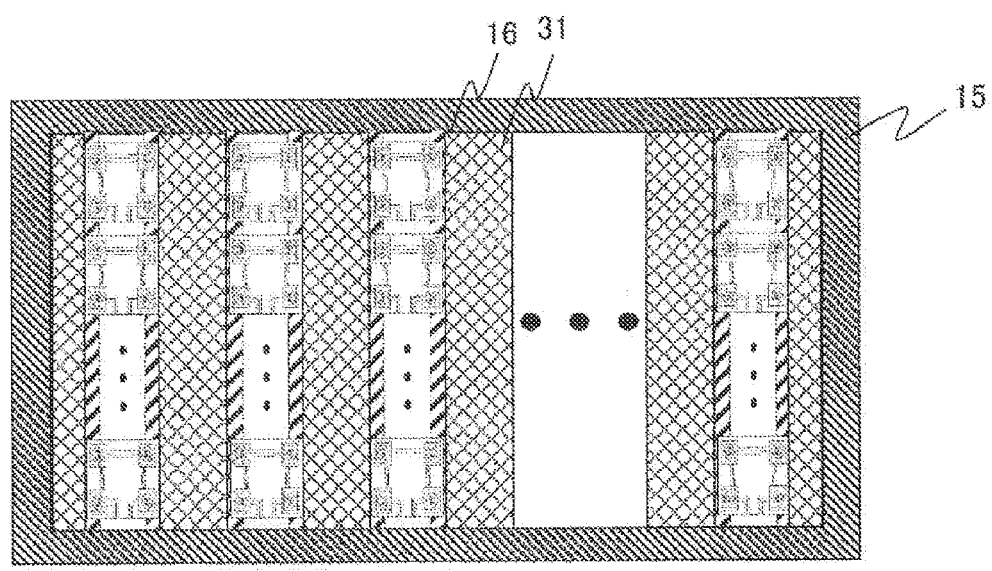
FIG. 40 is a top view illustrating the exemplary printed circuit boards accommodating the backlight device according to the fifth embodiment of the present invention, the heat radiation sheet, and a housing frame.

A fifth embodiment of the present invention is now described with reference to FIGS. 39 and 40.

Similarly to the cases of the first to fourth embodiments of the present invention, the backlight source module is manufactured. However, as illustrated in FIGS. 39 and 40, a heat radiation sheet 31 is provided between the printed circuit board modules 16 having a heat radiation region, and, after that, the optical reflection sheet 17 is mounted. The heat radiation sheet 31 is adhered using a high heat conduction sheet or a paste so as to be in contact with the copper thin films 12 in the heat radiation regions of the printed circuit board. This makes heat diffused and radiated from the heat radiation regions of the printed circuit board further to the heat radiation sheet. The heat radiation sheet 31 contains white ceramic filler particles, and heat is not only diffused but also radiated to the atmosphere. The structure makes it possible to transport heat generated from the LED element through the heat radiation regions of the printed circuit board and the heat radiation sheet to, ultimately, the housing frame, and, at the same time, to radiate the heat to the atmosphere. The heat radiation sheet 31 may include a layer containing white ceramic filler particles, or, alternatively, may be of a two-layer structure additionally including a metal layer such as an aluminum thin film layer or a copper thin film layer, or, may be a layer containing white ceramic filler particles sandwiched between metal layers such as aluminum thin film layers or copper thin film layers. The metal layer such as an aluminum thin film layer or a copper thin film layer is thermally connected to the heat radiation regions of the printed circuit board with high heat conduction, and thus, the amount of radiated heat becomes relatively larger. As a result, effective temperature of the LED element can be suppressed, and further, the electrical characteristics and the optical characteristics can be improved.

In this embodiment, with regard to the structure, because the thickness of the heat radiation sheet 31 is about the same as or smaller than that of the package 29 or of the ceramic substrate 28, a backlight source module which remains thin can be formed. The backlight module structure according to this embodiment may be applied not only to a backlight source module of a large liquid crystal display device but also to a backlight source module for a liquid crystal panel for a personal computer or an in-car navigation system or to other car-mounted light source modules.

While there have been described what are at present considered to be certain embodiments of the present invention, it will be understood that various modifications may be made thereto, and it is intended that the appended claims cover all such modifications as fall within the true spirit and scope of the invention.

What is claimed is:

1. A backlight device comprising:
a package light source having at least one LED element mounted at a center thereof;
a heat radiation region provided immediately below the at least one LED element;
one of an electrical connection wiring line and an electrical connection region provided on one of left side and right side of the at least one LED element and conducting to the at least one LED element so as to form an asymmetric conductive region;

a printed circuit board having the package light source mounted thereon, the printed circuit board having a heat radiation structure so as to correspond to the heat radiation region provided immediately below the at least one LED element; and a wiring region for the printed circuit board provided so as to correspond to the one of the electrical connection wiring line and the electrical connection region formed so as to be asymmetric;

wherein:

the package light source comprises at least two corresponding package light sources provided so as to be opposed to each other at the one of the electrical connection wiring line and the electrical connection region formed so as to be asymmetric with respect to the at least one LED element; and by mounting the at least two corresponding package light sources on the printed circuit board, the at least two corresponding package light sources each have an electric circuit region and a heat radiation region for the printed circuit board separated from each other, the electric circuit region being connected by wiring on an inner side of the printed circuit board to control the driving thereof, the heat radiation region for the printed circuit board being in end regions on outer sides of the printed circuit board and having a structure for radiating heat from immediately below the at least one LED element.

2. A liquid crystal display device comprising:

a pair of substrates;

a liquid crystal layer sandwiched between the pair of substrates; and the backlight device according to claim 1 for providing light into the liquid crystal layer.

3. A backlight device comprising:

a plurality of package light sources for mounting a plurality of LED elements thereon, the plurality of LED elements being mounted so as to be reflection symmetric with respect to the plurality of package light sources, the plurality of package light sources being provided so as to correspond to each other in at least two lines; and one of electrical connection wiring lines and electrical connection regions formed so as to be asymmetric with respect to the plurality of LED elements and opposed to each other, wherein, by mounting the plurality of package light sources so as to correspond to each other in the at least two lines on a printed circuit board, the plurality of package light sources have an electric circuit region and heat radiation regions for the printed circuit board separated from each other, the electric circuit region being connected by wiring on an inner side of the printed circuit board to control driving thereof, the heat radiation regions for the printed circuit board being in end regions on outer sides of the printed circuit board and having a structure for radiating heat from immediately below the plurality of LED elements.

4. A backlight device comprising a printed circuit board having one of a plurality of package light sources and a plurality of substrates mounted thereon, the one of the plurality of package light sources and the plurality of substrates having a plurality of LED elements mounted thereon, wherein the printed circuit board includes:

an electrical connection region corresponding to one of an inside region surrounded by the plurality of package light sources and a lower side of the mounted plurality of substrates and provided with electrical connection; and a heat radiation region corresponding to one of an outside of the region surrounded by the plurality of package light sources mounted on the printed circuit board and an outside of the mounted plurality of substrates including a part of a lower side of the plurality of substrates and having a structure of a material for heat radiation which transports heat by one of heat conduction and thermal diffusion, the electrical connection region and the heat radiation region being separated from each other on the printed circuit board.

5. A backlight device according to claim 4, wherein:

the one of the plurality of package light sources and the plurality of substrates comprise thermal via holes including holes reaching the printed circuit board and a metal plugging the holes, and through holes exhibiting conductivity for electrical connection; and the through holes for electrical connection and the thermal via holes for heat radiation are asymmetrically provided.

6. A backlight device according to claim 5, wherein:

the one of the plurality of package light sources and the plurality of substrates have LED elements connected to pads provided for the through holes exhibiting the conductivity, and a transparent resin for sealing the LED elements;

the one of the plurality of package light sources and the plurality of substrates are mounted on the printed circuit board; and the printed circuit board includes:

a region which is surrounded by the one of the plurality of package light sources and the plurality of substrates and on which switching elements for electrical circuit connection, a driver, a resistance, and a capacitor are mounted; and a region which is outside the region surrounded by the one of the plurality of package light sources and the plurality of substrates and in which a heat radiation structure is formed for heat transport by heat conduction and heat radiation by radiation using a heat radiation sheet containing one of a metal and a filler.

7. A backlight device according to claim 6, wherein:

the LED elements mounted on the one of the plurality of package light sources and the plurality of substrates having at least the thermal via holes are electrically connected through wiring to the printed circuit board;

the LED elements are mounted on metal regions including a metal plugging the thermal via holes; and the metal in the metal regions which plugs the thermal via holes and which is in contact with the LED elements is connected to the structure of the material for heat radiation of the printed circuit board to form a heat radiation structure for heat transport by heat conduction.

8. A backlight device according to claim 6, wherein:

the one of the plurality of package light sources and the plurality of substrates which have a plurality of the thermal via holes forming the heat radiation structure include one of the plurality of package light sources connected in series in groups of four and the LED elements on the plurality of substrates electrically connected in series in groups of four; and the electrical connection region and the heat radiation region are separated from each other on the printed circuit board having the one of the plurality of package light sources and the plurality of substrates mounted thereon.

9. A backlight device according to claim 6, wherein the one of the plurality of package light sources and the plurality of substrates having at least the thermal via holes include an LED light source backlight module formed of a ceramic material.

10. A backlight device according to claim 6, wherein:
the printed circuit board to which the one of the plurality of package light sources and the plurality of substrates having at least the thermal via holes are connected has a copper film having high thermal conductivity applied thereto at least in end regions;
by connecting the metal plugging the thermal via holes to the copper film of the printed circuit board, heat generated from the LED elements mounted on the thermal via holes is adapted to be radiated; and
by forming the printed circuit board in a shape of a rectangle which has a long side in a longitudinal direction, heat radiated by heat conduction through the copper film formed in end regions of the printed circuit board is adapted to be radiated to an upside of the printed circuit board.

11. A backlight device according to claim 6, wherein:
the plurality of LED elements connected to wiring lines provided for the one of the plurality of package light sources and the plurality of substrates having at least the thermal via holes are mounted on the wiring lines so as to be reflection symmetric; and
the plurality of LED elements comprise red LED elements, green LED elements, and blue LED elements and mounted so as to be reflection symmetric and sealed with a transparent resin.

12. A backlight device according to claim 6, wherein:
the one of the plurality of package light sources and the plurality of substrates having at least a plurality of the thermal via holes forming the heat radiation structure have the thermal via holes arranged linearly; and
the plurality of the thermal via holes can be proximate to each other in a continuous way on an upper surface and a lower surface of the one of the plurality of package light sources and the plurality of substrates having the thermal via holes formed therein.

13. A backlight device according to claim 6, wherein:
the printed circuit board to which the one of the plurality of package light sources and the plurality of substrates having at least the thermal via holes are connected has a copper film having high thermal conductivity applied thereto at least in end regions;
the printed circuit board is formed in a shape of a rectangle which has a long side in a longitudinal direction; and
the copper film at the end regions of the printed circuit board comprises a heat radiation sheet containing a white filler for diffusing and radiating heat attached thereto.

14. A backlight device according to claim 6, wherein:
the plurality of substrates having at least a plurality of the thermal via holes forming the heat radiation structure have on an upper surface thereof wiring for electrically connecting the LED elements; and
the LED elements are connected through the thermal via holes to a copper film having high thermal conductivity for heat radiation to a lower surface of the plurality of substrates, that is, to a surface of the printed circuit board.

15. A backlight device according to claim 6, wherein a length in a longitudinal direction of the printed circuit board having the one of the plurality of package light sources and the plurality of substrates mounted thereon, the one of the plurality of package light sources and the plurality of substrates having at least the thermal via holes, is adjusted and an appropriate number of the plurality of substrates are arranged on the printed circuit board.

* * * * *